United States Patent
Yuasa et al.

(10) Patent No.: US 7,495,870 B2
(45) Date of Patent: Feb. 24, 2009

(54) MAGNETORESISTIVE EFFECT ELEMENT, MAGNETIC HEAD, AND MAGNETIC REPRODUCING APPARATUS

(75) Inventors: Hiromi Yuasa, Kanagawa (JP); Hideaki Fukuzawa, Kanagawa (JP); Susumu Hashimoto, Kanagawa (JP); Hitoshi Iwasaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 800 days.

(21) Appl. No.: 10/954,545

(22) Filed: Oct. 1, 2004

(65) Prior Publication Data

US 2005/0111145 A1    May 26, 2005

(30) Foreign Application Priority Data

Oct. 2, 2003    (JP)    ............... 2003-344030

(51) Int. Cl.
G11B 5/33    (2006.01)
(52) U.S. Cl. .................................. 360/324.2
(58) Field of Classification Search ................ 360/324, 360/324.1–324.2; 29/603.11, 603.13, 603.15
See application file for complete search history.

(56) References Cited

U.S. PATENT DOCUMENTS

| | | | | | |
|---|---|---|---|---|---|
| 4,630,086 | A | * | 12/1986 | Sato et al. | 365/185.06 |
| 5,715,121 | A | * | 2/1998 | Sakakima et al. | 360/324.2 |
| 5,946,622 | A | * | 8/1999 | Bojeryd | 455/444 |
| 5,966,322 | A | * | 10/1999 | Pohm et al. | 365/158 |
| 6,002,553 | A | * | 12/1999 | Stearns et al. | 360/324 |
| 6,111,729 | A | * | 8/2000 | Kamiguchi et al. | 360/324.1 |
| 6,205,008 | B1 | * | 3/2001 | Gijs et al. | 360/324 |
| 6,348,274 | B1 | * | 2/2002 | Kamiguchi et al. | 428/811 |
| 6,400,537 | B2 | * | 6/2002 | Sakakima et al. | 360/324.2 |
| 6,473,275 | B1 | * | 10/2002 | Gill | 360/314 |
| 6,538,861 | B1 | * | 3/2003 | Hayashi et al. | 360/324.2 |

(Continued)

FOREIGN PATENT DOCUMENTS

JP    2000-137906    5/2000

(Continued)

OTHER PUBLICATIONS

M. Takagishi, et al., "The Applicability of CPP-GMR Heads for Magnetic Recording", IEEE Transactions On Magnetics, vol. 38, No. 5, Sep. 2002, pp. 2277-2282.

(Continued)

Primary Examiner—Mark Blouin
(74) Attorney, Agent, or Firm—Oblon, Spivak, McClelland, Maier & Neustadt, P.C.

(57) ABSTRACT

A magnetoresistive effect element includes a magnetization pinned layer, a magnetization free layer; a nonmagnetic metal layer disposed between the magnetization pinned layer and the magnetization free layer, a resistance increasing layer, a spin filter layer, and a pair of electrodes. The resistance increasing layer includes a insulation portion and is disposed in at least one of the magnetization pinned layer, the magnetization free layer, and the nonmagnetic metal layer. The spin filter layer is disposed to be adjacent to the magnetization free layer and has a thickness in a range of 5 nm to 20 nm. The magnetization free layer is disposed between the spin filter layer and the nonmagnetic metal layer. The magnetization pinned layer, the magnetization free layer, the nonmagnetic layer, the resistance increasing layer, and the spin filter layer are disposed between the electrodes.

17 Claims, 22 Drawing Sheets

U.S. PATENT DOCUMENTS

| | | | |
|---|---|---|---|
| 6,560,077 B2* | 5/2003 | Fujiwara et al. | 360/324.1 |
| 6,590,750 B2* | 7/2003 | Abraham et al. | 360/324.2 |
| 6,603,642 B1* | 8/2003 | Araki et al. | 360/324 |
| 6,759,084 B1* | 7/2004 | Ju et al. | 427/126.4 |
| 7,072,153 B2* | 7/2006 | Koui et al. | 360/324.1 |
| 7,218,483 B2* | 5/2007 | Yuasa et al. | 360/324.1 |
| 2002/0051380 A1 | 5/2002 | Kamiguchi et al. | |
| 2002/0073785 A1* | 6/2002 | Prakash et al. | 73/862.041 |
| 2003/0035256 A1* | 2/2003 | Hayashi et al. | 360/324.12 |
| 2003/0123200 A1* | 7/2003 | Nagasaka et al. | 360/324.1 |
| 2004/0021990 A1 | 2/2004 | Koui et al. | |
| 2004/0086751 A1* | 5/2004 | Hasegawa et al. | 428/692 |
| 2005/0002126 A1* | 1/2005 | Fujiwara et al. | 360/324.1 |

FOREIGN PATENT DOCUMENTS

| | | |
|---|---|---|
| JP | 2002-157711 | 5/2002 |
| JP | 2002-208744 | 7/2002 |
| JP | 2002-353535 | 12/2002 |
| JP | 2003-188440 | 7/2003 |

OTHER PUBLICATIONS

M. A. Howson, et al., "Magnetic Multilayers of FE/AU: Role of the Electron Mean Free Path", J. Phys.: Condens. Matter 11, 1999, pp. 5717-5722.

K. Nagasaka, et al. "Giant Magnetroresistance Properties of Specular Spin Valve Films in a Current Perpendicular to Plane Structure", Journal of Applied Physics, vol. 89, No. 11, Jun. 1, 2001, pp. 6943-6945.

U.S. Appl. No. 10/954,545, filed Oct. 01, 2004, Yuasa et al.
U.S. Appl. No. 11/017,965, filed Dec. 22, 2004, Yuasa et al.
U.S. Appl. No. 10/659,299, filed Sep. 11, 2003, Susumu Hashimoto et al.

* cited by examiner

MAGNETORESISTIVE EFFECT ELEMENT, MAGNETIC HEAD, AND MAGNETIC REPRODUCING APPARATUS

This application is based upon and claims the benefit of priority from the prior Japanese Patent Application No.2003-344030 filed on Oct. 2, 2003; the entire contents of which are incorporated herein by reference.

BACKGROUND OF THE INVENTION

1. Field of the Invention

The present invention relates to a magnetoresistive effect element, a magnetic head and a magnetic reproducing apparatus, and more particularly, relates to a magneto resistive effect element having a structure for flowing a sense current in a direction perpendicular to a film surface of a magnetoresistive effect film, and a magnetic head and a magnetic reproducing apparatus using this magnetoresistive effect element.

2. Description of the Related Art

In recent years, compactness and an increase in capacity of a magnetic recording medium have been advanced, and the relative speed between the magnetic head for reproduction and the magnetic recording medium at an information reading time is reduced. Therefore, we have large expectations for a magnetoresistive effect head (MR head) that can take out a large output even at a low relative speed.

With respect to such expectation, an example was reported in which a large magnetoresistive effect was realized by an element that has a multilayer film of the sandwich structure of a ferromagnetic layer/nonmagnetic layer/ferromagnetic layer wherein a ferromagnetic layer is not antiferromagnetically coupled. Namely, magnetization is pinned by applying an exchange bias magnetic field to one (called "a pinned layer" or "a magnetization pinned layer") of two ferromagnetic layers nipping a nonmagnetic layer (called "a spacer layer" or "an intermediate layer"), while the other ferromagnetic layer (called "a free layer" or "a magnetization free layer") is inverted in the magnetization by an external magnetic field (signal magnetic field). Thus, the large magnetoresistive effect is obtained by changing the relative angle of magnetizing directions between the two ferromagnetic layers arranged such that the nonmagnetic layer is disposed therebetween. The multilayer film of such a type is called "a spin valve".

Since the spin valve can saturate the magnetization by a low magnetic field, the spin valve is suitable for the MR head and is already practically used. However, its magnetoresistive changing ratio is about 20% at its maximum.

The magnetoresistive effect elements are classified into a structure of a CIP (Current-in-Plane) type in which a sense current flows in a direction parallel to the element film face, and a structure of a CPP (Current Perpendicular to Plane) type in which the sense current flows in a direction perpendicular to the element film face. It has been reported that the magnetoresistive effect element of the CPP type shows a magnetoresistive changing ratio about ten times that of the element of the CIP type (see J. Phys. Condens. Matter., vol. 11, p. 5717 (1999)). It is not impossible to achieve the magnetoresistive changing ratio 100%.

However, in the case of the spin valve structure, the total film thickness of a spin-depending layer is very thin, and the number of interfaces is small. Accordingly, when a current vertically flows in the element of the CPP type, its resistance itself is small and an output absolute value is also small.

In contrast to this, the technique of inserting a current increasing layer including an insulator into the film of the spin valve is devised to improve the magnetoresistive effect (MR) (see J. Appl. Phys. 89, p6943 (2001)). In this technique, the spin valve includes a portion (pinned layer/spacer layer/free layer) for spin-dependently scattering an electron and a portion (a buffer layer, an antiferromagnetic layer, a protecting layer, etc.) having small spin-dependent scattering. When the former resistance is expressed as Rsd and the latter resistance is expressed as Rsi, the MR of the spin valve can be shown as MR=ΔRsd/(Rsi+Rsd). Since the phenomenon that the MR is more improved as Rsd is greater than Rsi is focused, the current increasing layer including the insulator is inserted as mentioned above.

On the other hand, an attempt to improve the MR by inserting a spin filter layer formed of Cu (copper) of 1 nm in thickness in the MR element of the CPP type is reported (see IEEE Trans. Magn. 38, 2277 (2002)).

BRIEF SUMMARY OF THE INVENTION

However, when the insulator, etc. are inserted into the central portion of the spin valve on the basis of the technique disclosed in J. Appl. Phys., 89, p. 6943 (2001), the problem occurs in that the crystallinity of a film forming the spin valve is deteriorated. The spin valve is basically formed of a polycrystal thin film of fcc in the crystal structure, and the crystal is often oriented in a plane (111). Quality of the crystallinity has an influence on the MR of CCP-GMP in the following three viewpoints.

The first viewpoint is sharpness (steep property) of each interface between the pinned layer/spacer layer/free layer. These interfaces contribute to the MR by the "spin-dependent interface scattering". When the interfaces are not sharp due to the influence of interface mixing or interface irregularities, interface resistance not depending on the spin increases. As a result, a spin-dependent interface scattering factor is deteriorated, so that the MR is reduced.

The second viewpoint is the orientation within the pinned layer and the free layer. The pinned layer and the free layer, which are made of ferromagnetic materials, contribute to the MR by "spin-dependent bulk scattering" within these layers. When the crystal orientation is reduced, the "spin-dependent scattering factor" of an electron is deteriorated, so that the MR is reduced.

The third viewpoint is the crystal orientation of the spacer layer. When a defect in the film increases, the spin diffusion length (distance until the spin of the electron is inverted) of the electron is shortened, so that the MR is reduced.

For the above reasons, it is important to suppress the deterioration of the crystal orientation of the spin valve due to the insertion of the insulating layer at minimum.

The present invention is made on the basis of recognition of such problems and provides a magnetoresistive effect element for realizing a high magnetoresistive changing amount by inserting a spin filter layer including a nonmagnetic metal for improving the crystallinity between the free layer and the protecting layer, to suppress the above deterioration of the crystal orientation or restore the crystal orientation, and a magnetic head and a magnetic reproducing apparatus using this magnetoresistive effect element.

To achieve the above object, according to one embodiment of the invention, a magnetoresistive effect element includes a magnetization pinned layer, a magnetization free layer, a nonmagnetic metal layer, a resistance increasing layer, a spin filter layer, and a pair of electrodes. The magnetization pinned layer includes a magnetic-material film in which a magnetization direction is substantially pinned in one direction. The magnetization free layer includes a magnetic-material film in which a magnetization direction changes in response to an external magnetic field. The nonmagnetic metal layer is disposed between the magnetization pinned layer and the magnetization free layer. The resistance increasing layer includes an insulation portion and a conductive portion electrically connecting both film faces of the resistance increasing layer, and is disposed in at least one of the magnetization pinned layer, the magnetization free layer, and the nonmagnetic metal layer. The spin filter layer is disposed to be adjacent to the magnetization free layer and has a thickness in a range of 5 nm to 20 nm. The magnetization free layer is disposed between the spin filter layer and the nonmagnetic metal layer. The magnetization pinned layer, the magnetization free layer, the nonmagnetic layer, the resistance increasing layer, and the spin filter layer are disposed between the electrodes. Current that flows between the pair of electrodes flows in a direction substantially perpendicular to film faces of the magnetization pinned layer, the magnetization free layer, the nonmagnetic metal layer, the resistance increasing layer, and the spin filter layer.

Furthermore, according to one embodiment of the invention, a magnetic head includes this magnetoresistive effect element.

Also, according to one embodiment of the invention, a magnetic reproducing apparatus includes this magnetic head and can read information magnetically recorded in a magnetic recording medium.

As described above in detail, according to one embodiment of the invention, since the resistance increasing layer and the spin filter layer having thickness in a range of 5 nm to 20 nm are provided, the resistance of high absolute value and large magnetoresistive effect can be obtained.

As a result, it becomes possible to provide a magnetic head that can acquire magnetic detection at high sensitivity stably and has large output and high S/N ratio even at high recording density; a magnetic reproducing apparatus including this magnetic head; and a highly-integrated magnetic memory. Accordingly, the invention has a great advantage in the industry.

DETAILED DESCRIPTION OF THE INVENTION

Embodiments of the invention will be described below with reference to the drawings.

First Embodiment

Figure 1:
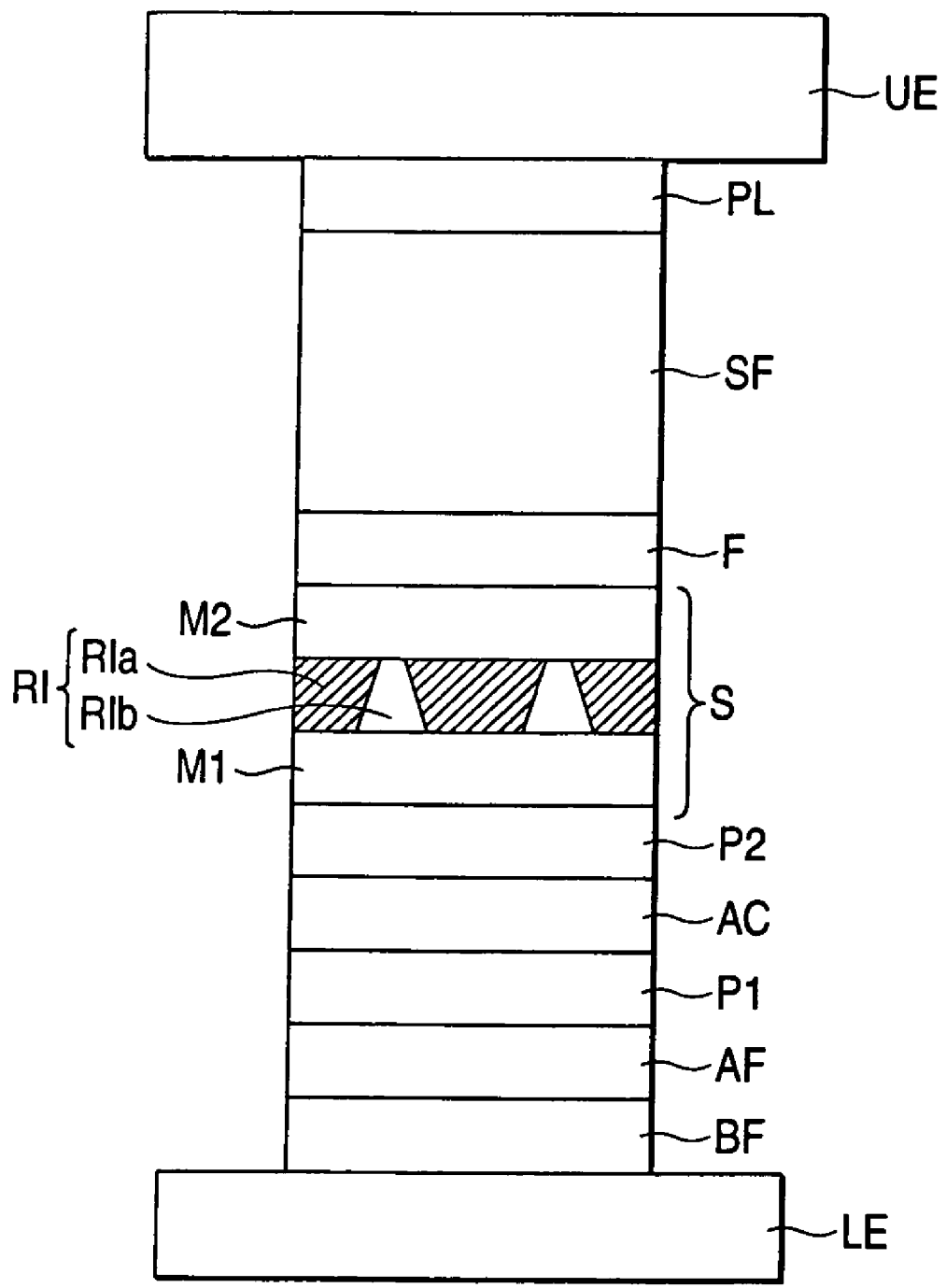
FIG. 1 is a typical view showing a sectional structure of a main portion of a magnetoresistive effect element according to a first embodiment of the invention.

FIG. 1 is a typical view showing a sectional structure of a main portion of a magnetoresistive effect element according to a first embodiment of the invention.

Namely, the magnetoresistive effect element of this embodiment has a structure in which a laminating film structure including a spin valve structure is arranged between a lower electrode LE and an upper electrode UE. A sense current can be flowed through the lower electrode LE and the upper electrode UE in a direction substantially perpendicular to the film thickness direction of the spin valve, and GMR of the CPP type is realized.

The spin valve structure of this embodiment will be explained. A first pinned layer (magnetization pinned layer) P1, a second pinned layer (magnetization pinned layer) P2, a free layer (magnetization free layer) F, and a spacer layer (nonmagnetic metal layer) S, which is disposed between the layer P1/P2 and the layer F, are provided.

Here, the magnetization of the first pinned layer P1 is substantially pinned to one direction by an antiferromagnetic layer AF adjacent to this first pinned layer P1. Further, the magnetization of the second pinned layer P2 is pinned to the direction opposed to the first pinned layer P1 through a magnetization antiparallel coupling layer AC.

Further, the free layer F includes a ferromagnetic-material film in which its magnetization can be changed in accordance with an external magnetic field. In contrast to this, the spacer layer S has a function of blocking the magnetic coupling between the second pinned layer P2 and the free layer F. In this embodiment, the spacer layer S has a structure in which a metal layer M1, a resistance increasing layer RI and a metal layer M2 are laminated in this order. The metal layers M1, M2 are made of a nonmagnetic metal. In contrast to this, the resistance increasing layer RI has an insulating portion RIa and a conductive portion RIb that approximately extends through a portion of the insulating portion RIa in the thickness direction and is made of a nonmagnetic material. Ohmic contacts are formed between the resistance increasing layer R (the conductive portion RIb) and the metal layers M1, M2. Namely, the resistance increasing layer RI increases the electric resistance of the magnetoresistive effect element and the conduction of the sense current in the direction perpendicular to the film face is secured through the conductive portion RIb.

An increase in the magnetoresistive effect (MR) using the resistance increasing layer RI will be explained as follows. Namely, the spin valve of a perpendicular conducting type can be divided into two from a viewpoint as to whether a conduction electron is spin-dependently scattered or not. One is a portion (pinned layer/spacer layer/free layer) that contributes to the spin-dependent scattering, and the other is a portion (a buffer layer, a protecting layer, an antiferromagnetic layer, etc.) not depending on the spin. Here, the former resistance is expressed as Rsd and the latter resistance is expressed as Rsi. When the resistance increasing layer is provided in the portion that contributes to the spin-dependent scattering, the ratio of the resistance Rsd to the resistance Rsi is raised, so that MR=$\Delta$Rsd/(Rsd+Rsi) can be raised. It has been known that when the resistance increasing layer RI is actually inserted into the spacer layer, the MR is increased up to about 8 times in comparison with a case where no resistance increasing layer RI is inserted (see U.S. 2002/0048128 A1).

The lower electrode LE is disposed below the antiferromagnetic layer AF through a buffer layer BF. In contrast to this, a spin filter layer SF is laminated on the free layer, and the upper electrode UE is disposed thereabove through a protecting layer PL.

The protecting layer PL has a function of protecting each layer forming the spin valve structure from e.g., etching gas, plasma, etc during the manufacturing of the magnetoresistive effect element. Therefore, the material of the protecting layer PL is preferably a material, which is high in physical or chemical durability and is inactive. Specifically, it is preferable to use one of tantalum (Ta), titanium (Ti), ruthenium (Ru), and gold (Au).

The protecting layer PL is normally disposed just above an active portion of the spin valve structure. Namely, in the case of the spin valve of a so-called "bottom type" in which the antiferromagnetic layer is disposed below, the protecting layer PL is disposed above the free layer. In the case of the spin valve of a so-called "top type" in which the antiferromagnetic layer is disposed above, the protecting layer PL is disposed above the antiferromagnetic layer. In the case of a so-called "dual type" having two pinned layers, the protecting layer PL is disposed above the antiferromagnetic layer.

In contrast to this, in this embodiment, the spin filter layer SF is disposed just below the protecting layer PL. Thus, mixing, etc. at the interface between the spin valve active portion and the protecting layer SF are excluded and the improvement of the crystallinity of the spin valve can be promoted.

In the magnetoresistive effect element having the structure explained above, samples having the material of each layer sequentially seen from the lower electrode LE and the film thickness as follows were made. Namely, the buffer layer BF was Ta 5 nm/Ru 2 nm. The antiferromagnetic layer AF was PtMn 15 nm. The pinned layer P1 was $Co_{90}Fe_{10}$ 3 nm. The magnetization antiparallel coupling layer AC was Ru 1 nm. The pinned layer P2 was $Co_{90}Fe_{10}$ 3 nm. The spacer S was Cu 0.2 nm (metal layer M1)/$AlO_x$ 1.5 nm (insulating portion RIa of the resistance increasing layer) and Cu (conductive portion RIb of the resistance increasing layer RI)/Cu 0.5 nm (metal layer M2). The free layer F was $Co_{90}Fe_{10}$ 1 nm/$Ni_{80}Fe_{20}$ 3.5 nm. The spin filter layer SF was Cu 0 nm to 50 nm. The protecting layer PL was Ta 20 nm.

Figure 2:
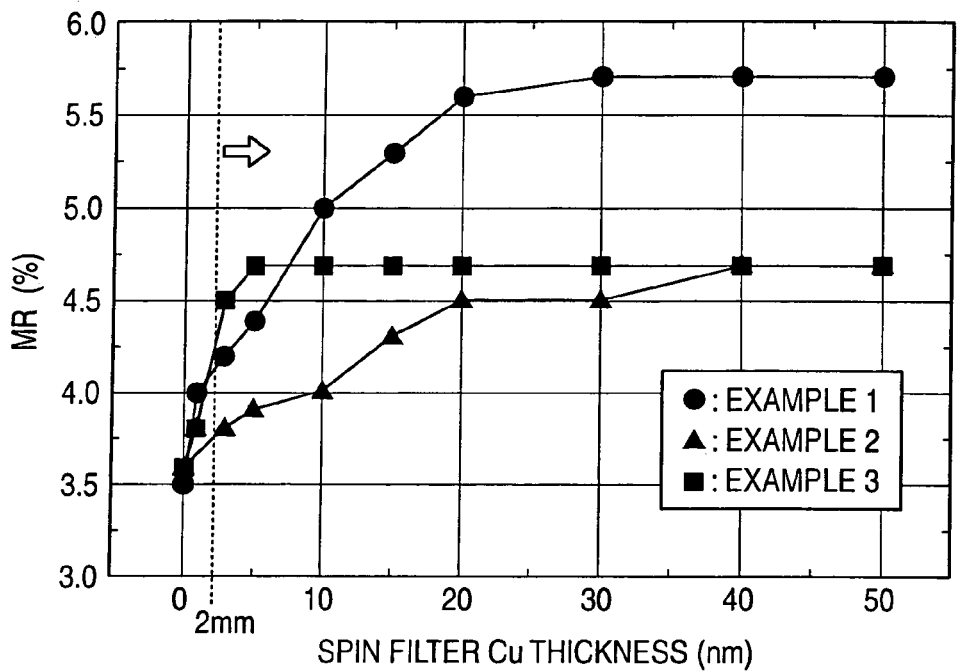
FIG. 2 is a graph showing a magnetoresistive changing amount MR [%] of the magnetoresistive effect element.

FIG. 2 is a graph showing the magnetoresistive changing amounts MR [%] of these magnetoresistive effect elements. Namely, the axis of abscissa of FIG. 2 shows the thickness of the spin filter layer SF, and the axis of ordinate shows the magnetoresistive changing amount MR (=A$\Delta$R/AR) where A represents an area element size and R represents a resistance of the samples. In this figure, "Example 1" shows results of this embodiment.

As can be seen from FIG. 2, when there is no spin filter layer SF (thickness is zero), the MR is 3.5%. In contrast to this, when a Cu layer of 1 nm in thickness is provided as the spin filter layer SF, it can be seen that the MR is raised to 4.0%. As a reason for this MR improvement, it is considered that the spin-dependent scattering at a NiFe/Cu interface (when the spin filter layer SF is provided) is larger than that at an NiFe/Ta interface (when there is no spin filter layer SF) Thus, it can be seen that it is effective in the MR improvement to insert Cu as the spin filter layer SF.

In this embodiment, when the Cu layer, which functions as the spin filter layer SF, is made thicker than 1 nm, the MR is more increased until the Cu layer has 20 nm in thickness. The MR is substantially saturated thereafter. Thus, as shown by a dotted line in FIG. 2, it has been found that it is very effective in the MR improvement to set the spin filter layer SF to 2 nm or more, preferably, 10 nm or more in thickness. The film thickness providing a more notable effect is 5 nm or more and 20 nm or less.

A structure in which the spin filter layer is provided in the spin valve of the GMR element of the CIP type has already been known (see U.S. Pat. No. 6,338,899). However, an object of the U.S. Pat. No. 6,338,899 is different from that of this embodiment and is to control a bias magnetic field to the free layer using the sense current.

Figure 3:
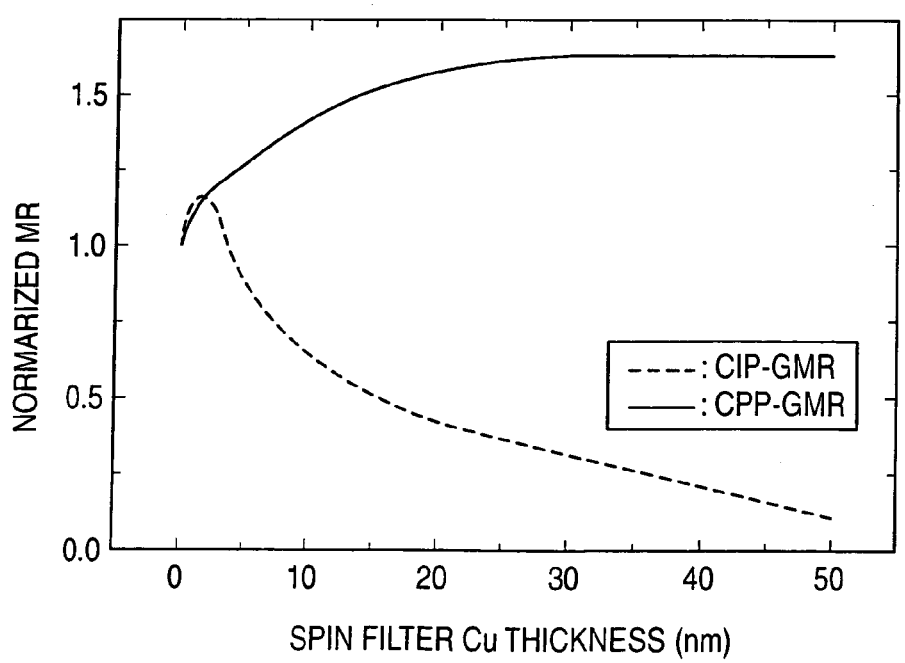
FIG. 3 is a graph showing a change in MR when a Cu layer is provided as a spin filter layer in each of a GMR element of the CIP type and a GMR element of the CPP type.

FIG. 3 is a graph showing a change in MR when the Cu layer, which functions as the spin filter layer, is provided in each of the GMR element of the CIP type and the GMR element of the CPP type.

Namely, in the case of the CIP-GMR element, the MR is improved by arranging the thin spin filter layer of several nm or less. However, when the thickness of the spin filter layer is thicker than this thickness, the MR is damaged by a shunt current, so that the MR is suddenly reduced.

In contrast to this, when the spin filter layer SF of Cu is provided according to this embodiment and its film thickness is changed from 1 nm, the MR is further raised and saturated after the film thickness exceeds 20 nm. Namely, in comparison with the element of the CIP type, a notable increase in MR is obtained when the thick spin filter layer SF is provided in the CPP type element.

By the way, IEEE Trans. Magn. 38, p. 2277 (2002) discloses that the Cu layer of about 1 nm in thickness is inserted in the CPP-GMR element. However, an object of this disclosed technique is to use a combinational of free layer/spin filter layer interface greater than a free layer/protecting layer interface in the-spin-dependent interface scattering. Namely, this disclosed technique focuses on the effect of the interface of the spin filter layer and does not teach or suggest making its film thickness be thicker than the thickness (about 1 nm), which is normally used in the spin filter layer of the related art.

In contrast to this, the inventors have found that the MR is notably increased as shown in FIG. 2 by providing the spin filter layer SF having a thickness conceptually exceeding the thickness of the "spin filter layer" of the related art. In this embodiment, the improvement of the crystallinity is considered as one of the reasons for the great increase in MR by providing the spin filter layer SF of 2 nm or more in thickness.

Namely, when the laminating structure shown in FIG. 1 is sequentially formed from the lower electrode LE, amorphous $AlO_x$ is formed as the insulating portion RIa of the resistance increasing layer RI included in the spacer layer S. Therefore, the crystallinity of the metal layer M2 formed thereon, that of the conductive portion RIb in the resistance increasing layer RI, and that of free layer F are apt to degraded. With respect to this degradation, when the spin filter layer SF of Cu is thickly formed on the free layer F, the crystallinity of the spin filter layer SF is improved. It appears that the crystallinity of the spin valve is also improved as this crystallinity of the spin filter layer SF is improved. Namely, it appears that since the crystallinity of the metal layer (spin filter layer SF) formed on the free layer F is improved, an annealing action or a buffering action is given in the crystallinity of the lower free layer F, that of the further lower metal layer M2 and that of the conductive portion RIb due to an influence of this improvement in the spin filter layer SF. As its result, the crystallinity of the free layer F, that of the metal layer M2 and that of the conductive portion RIb are improved.

The origin of CPP-GMR is two scatterings, that is, (1) spin-dependent bulk scattering in a ferromagnetic layer, and (2) spin-dependent interface scattering at an interface between a nonmagnetic layer and the ferromagnetic layer. Resistance due to (3) scattering except for these two scatterings merely causes reducing of the MR. When this is applied to the embodiment, the resistance in the pinned layer P and the free layer F corresponds to (1) the spin-dependent bulk scattering, and the resistance at the interface between the spacer layer S and the pinned layer P and the interface between the spacer layer S and the free layer F correspond to (2) the spin-dependent interface scattering. When the crystallinity is improved by increasing the thickness of the spin filter layer SF, (1) and (2) are improved and (3) is reduced, so that the MR can be improved. This will next be explained with reference to a case where the resistance increasing layer RI is provided in the spacer layer S.

A first cause is the improvement of the spin-dependent bulk scattering (1) due to the improvement of the crystallinity of the free layer F. When a defect, a disturbance of orientation, etc. within the free layer F exist, a conduction electron having a down spin is not only scattered, but an electron having the up spin is also scattered. Therefore, the difference in resistance between the both electrons, i.e., a spin-dependent scattering factor is reduced. Here, when the insertion of the spin filter layer SF improves the crystallinity, which is deteriorated due to the insertion of the resistance increasing layer, no electron having the up spin is scattered, so that the spin-dependent bulk scattering is increased and the MR is thereby improved.

A second cause is the improvement of (2) the spin-dependent interface scattering due to the improvement of the interface between the free layer F and the metal layer M2. When the interface is disturbed by the resistance increasing layer RI and flatness at an atom level is lost and mixing is increased, the electron having the up spin is also scattered as well as the electron having the down spin. Therefore, the difference in resistance between these electrons, i.e., the spin-dependent scattering factor is reduced. Here, when the interface between the metal layer M2 and the free layer F is modified by the spin filter layer SF, no unnecessary scattering is applied to the up spin and the spin-dependent interface scattering approaches an ideal film, i.e., a flat state having no mixing, so that the MR is improved.

A third cause is a reduction of (3) resistance not depending on the spin due to the improvement of the crystallinity of the spacer layer S. The spacer layer S includes the metal portion (metal layers M1, M2, conductive portion RIb) having small resistance and the insulating portion RIa having large resistance. When a conduction electron is subjected to scattering except for the spin-dependent scattering, unnecessary resistance is raised, so that the MR is reduced. Accordingly, it is ideal that the spin-polarized conduction electron passes through the metal portion in the spacer layer S without scattering. Therefore, it is preferable that a scattering factor such as a defect, impurities, etc. is as small as possible in the metal portion in the spacer layer S. When the spin filter layer SF improves the crystallinity, the scattering not depending on the spin is reduced, so that the MR can be increased.

As mentioned above, the optimum spin filter layer SF is very effective in the MR improvement.

Further, magnetic characteristics of the free layer F are also improved as well as the improvement in the conduction. When the crystal orientation of the free layer F is deteriorated, soft magnetic characteristics and the characteristics of magnetic strain indispensable as device characteristics become worse. These are significant characteristics in view of sensitivity to a signal magnetic field. Accordingly, it is a significant effect that the magnetic characteristics of the free layer F are improved by the spin filter layer SF.

Thus, the optimum spin filter layer SF is very effective for improving total performance of an element.

The above explanation relates to a case where the resistance increasing layer RI exists in the spacer layer S. However, similar effects are also obtained when the resistance increasing layer RI is inserted into the free layer F and/or the pinned layer P.

For example, even when the resistance increasing layer RI is disposed in the pinned layer P, (1) the spin-dependent bulk scattering in the pinned layer P and the free layer F is improved and (2) the spin-dependent interface scattering is improved by improving a pinned layer/spacer layer interface and a spacer layer/pinned layer interface. Further, (3) the scattering not depending on the spin in the spacer layer S is restrained and the MR is increased.

Further, even when the resistance increasing layer RI is disposed in the free layer F, the crystallinity of the free layer F is improved. Therefore, (1) the spin-dependent bulk scattering in the free layer F is improved and the MR is improved.

As a result of studies of the present inventors, the improvement of the MR has also been obtained as shown in FIGS. 2 and 3 when the following enumerated materials are used as the material of the spin filter layer SF in addition to Cu. Namely, Au, Ag, Pt, Cr, Ti, Zn, Zr, Nb, Pd, Rh, Ru, Mo, Hf, Ta, and $(Ni_{100-x}Fe_x)_{100-y}Cr_y$ alloy (15<x<25, 20<y<45) can be enumerated as the material of the spin filter layer SF except for Cu. Further, the spin filter layer SF may also have a laminating structure in which these materials are combined. For example, similar effects are also obtained when a structure laminated as in Cu 2 nm/Ru 5 nm from the side of the free layer is used as the spin filter layer SF.

In particular, Cu, Ru, and $(Ni_{100-x}Fe_x)_{100-y}Cr_y$ alloy (15<x<25, 20<y<45) are very effective as the material of the spin filter layer SF since the crystal structure or lattice constant is the same or close to fcc(111), which is the crystal structure of the spin valve normally used. Further, the other materials are effective in the meaning that the entire crystallinity is improved by increasing the total film thickness of the spin valve.

On the other hand, a material of high resistance including an oxide, a nitride, or a fluoride, etc. of an element of at least one selected from the group consisting of Al, Si, Ti, V, Cr, Mn, Fe, Co, Ni, Cu, Zn, Y, Zr, Nb, Hf, Ta and W can be used as the material of the insulating portion RIa of the resistance increasing layer RI. Since high resistance is obtained even in a thin film of these materials, the effect of an increase in MR due to the resistance increase is obtained. When the insulating portion RIa of the resistance increasing layer RI includes at least one of these materials, the MR is apt to be restrained by reducing the crystallinity of the free layer formed on this insulating portion RIa. In contrast to this, in accordance with this embodiment, the crystallinity of the free layer F is improved by providing the thick spin filter layer SF, so that the MR can be greatly increased.

Figure 4:
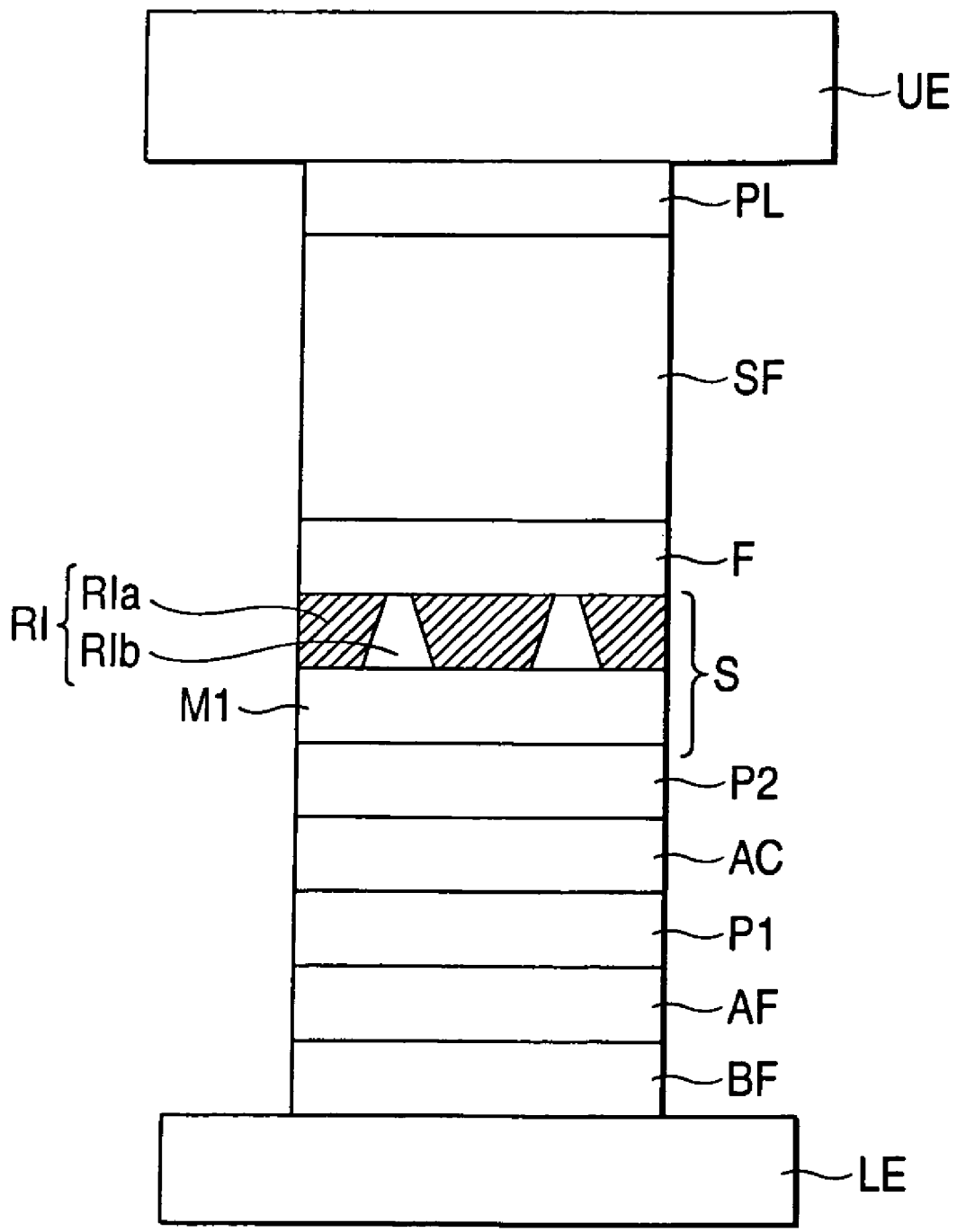
FIG. 4 is a typical sectional view showing a modified example of the first embodiment.
Figure 5:
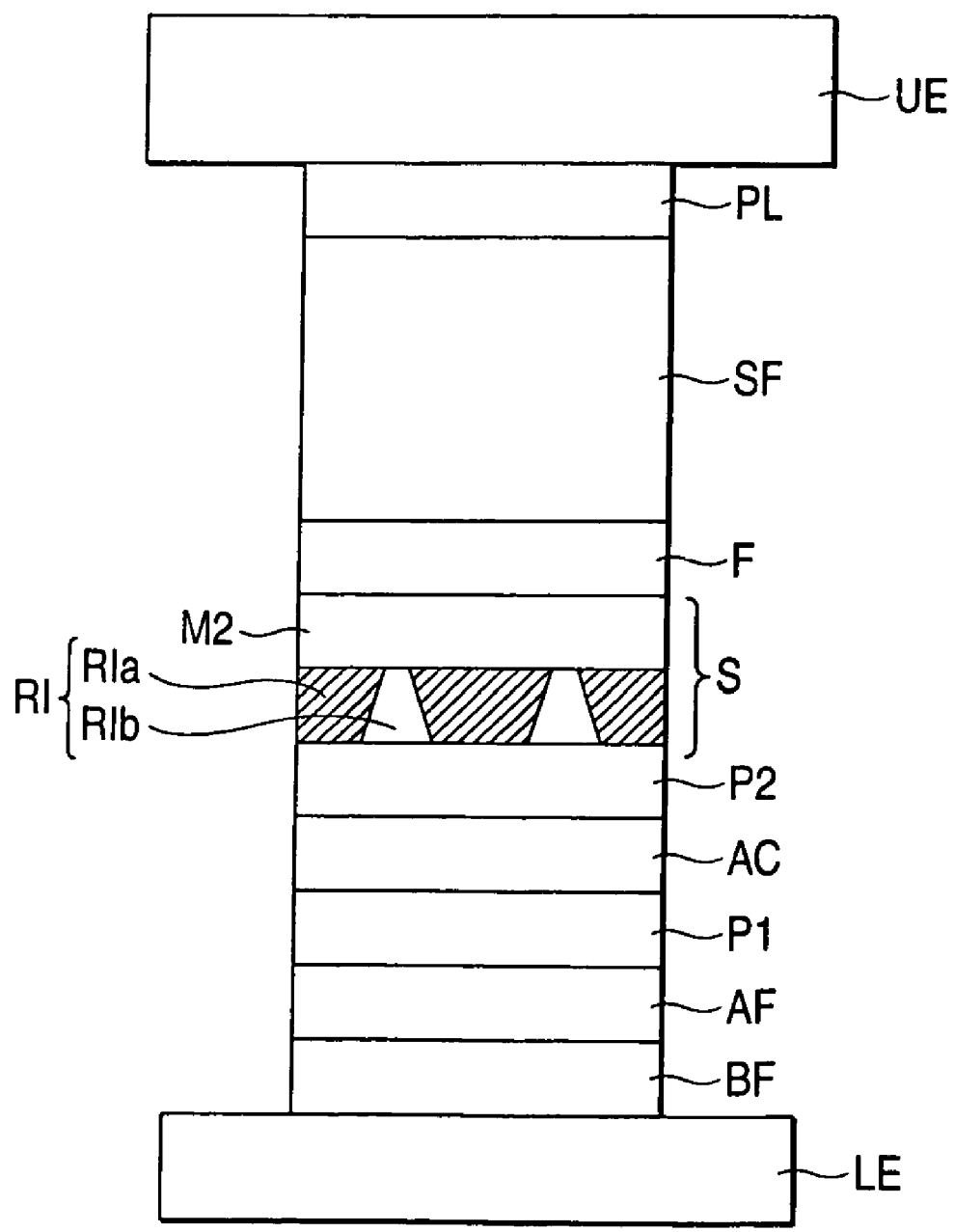
FIG. 5 is a typical sectional view showing a modified example of the first embodiment.
Figure 6:
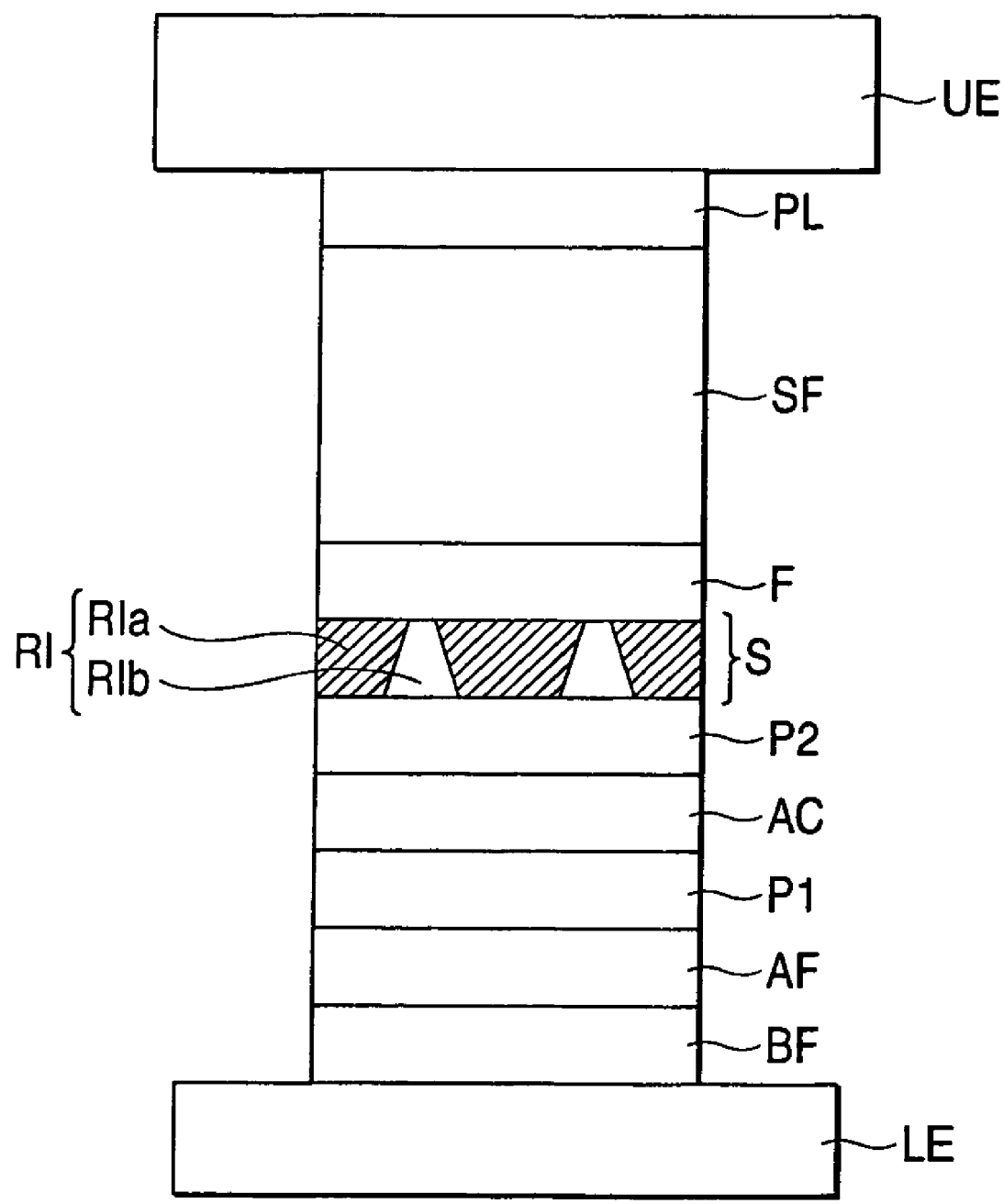
FIG. 6 is a typical sectional view showing a modified example of the first embodiment.

FIGS. 4 to 6 are typical sectional views showing modified examples of this embodiment. With respect to these figures, elements similar to those mentioned above with reference to FIGS. 1 to 3 are designated by the same reference numerals and their detailed explanations are omitted here.

Namely, as shown in FIG. 4, the spacer layer S may have a laminating structure of the metal layer M1 and the resistance increasing layer RI when the spacer layer S is seen from the side of the lower electrode LE. Further, as shown in FIG. 5, the spacer layer S may have a laminating structure of the resistance increasing layer RI and the metal layer M2. Further, as shown in FIG. 6, the spacer layer S may have only the resistance increasing layer RI.

In each of these modified examples, the MR improving effect is obtained by increasing the film thickness of the spin filter layer SF as shown in FIGS. 2 and 3.

Second Embodiment

Described as a second embodiment of the invention will be a GMR element of the CPP type in which a thick spin filter layer SF is inserted into a spin valve film including a resistance increasing layer in a free layer.

Figure 7:
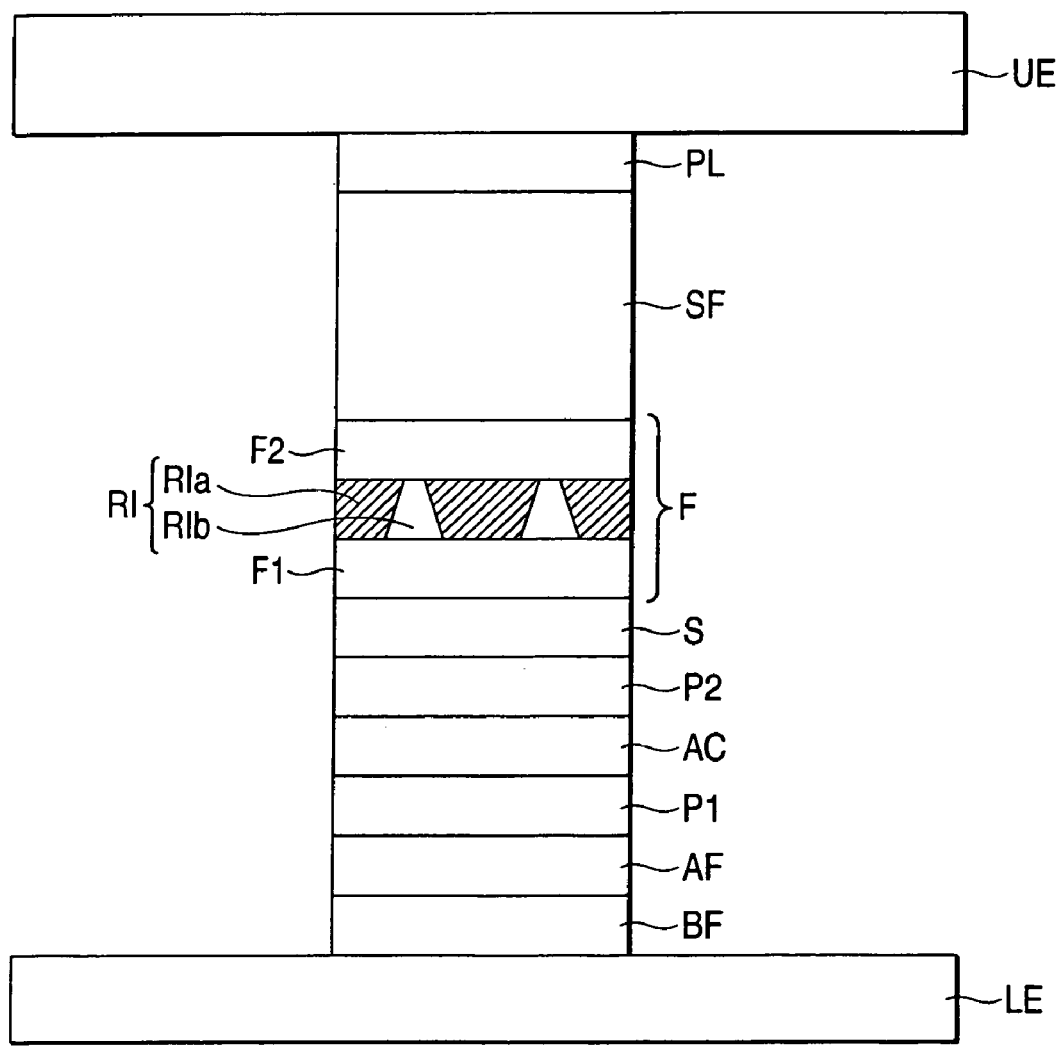
FIG. 7 is a typical view showing a sectional structure of a main portion of a magnetoresistive effect element according to a second embodiment of the invention.

FIG. 7 is a typical view showing the sectional structure of a main portion of a magnetoresistive effect element of this embodiment. In FIG. 7, elements similar to those in the structures shown FIGS. 1 to 6 are designated by the same reference numerals, and their detailed explanations will be omitted.

The magnetoresistive effect element of this embodiment also has a spin valve structure including a pinned layer, a free layer and a spacer layer S disposed therebetween. Each of these layers has a function as mentioned above in the first embodiment. However, in this embodiment, the spacer layer S includes a single layer made of a nonmagnetic material. The free layer includes a first free layer F1, a second free layer F2 and a resistance increasing layer RI disposed therebetween. The first and second free layers F1, F2 are layers made of a magnetic material and including a ferromagnetic film changeable in magnetization in accordance with an external magnetic field. On the other hand, the resistance increasing layer RI has an insulating portion RIa and an conductive portion RIb approximately extending through a portion of the insulating portion RIa in the thickness direction similarly to the above resistance increasing layer RI of the first embodiment. The conductive portion RIb is made of a ferromagnetic material such as $Ni_xFe_{1-x}$. Ohmic contacts are formed between the resistance increasing layer R (the conductive portion RIb) and the first and second free layers F1, F2. Namely, the resistance increasing layer RI increases the electric resistance of the magnetoresistive effect element, and the conduction of a sense current in the direction perpendicular to the film face is secured through its conductive portion RIb.

In this magnetoresistive effect element, samples were made in the following order seen from the lower electrode LE. A buffer layer BF was Ta 5 nm/Ru 2 nm. An antiferromagnetic layer AF was PtMn 15 nm. A first pinned layer P1 was $Co_{90}Fe_{10}$ 3 nm. A magnetization antiparallel coupling layer AC was Ru 1 nm. A second pinned layer P2 was $Co_{90}Fe_{10}$ 3 nm. A spacer layer S was Cu 5 nm. A free layer F was $Co_{90}Fe_{10}$ 1 nm (first free layer F1)/$Ni_{80}Fe_{20}$ 3.5 nm (first free layer F1)/AlO 1.5 nm (insulating portion RIa of the resistance increasing layer RI) and $Ni_{80}Fe_{20}$ (conductive portion RIb of the resistance increasing layer RI)/$Ni_{80}Fe_{20}$ 0.5 nm (second free layer F2). A spin filter layer SF was Cu 0 nm to 50 nm. A protecting layer PL was Ta 20 nm. Namely, the laminating structure of $Co_{90}Fe_{10}$ 1 nm/$Ni_{80}Fe_{20}$ 3.5 nm was adopted as the first free layer F1.

The magnetoresistive changing amounts MR [%] of these samples are shown as "Example 2" in FIG. 2.

Namely, when there is no spin filter layer SF (zero nm), the MR is 3.6%. In contrast to this, when the Cu layer of 1 nm in thickness is disposed as the spin filter layer SF, it has been found that the MR is raised to 3.8%. It is considered that the reason for this MR improvement depends on an interface effect due to the insertion of the spin filter layer SF. Namely, it appears that the MR is increased since the spin-dependent interface scattering is increased at the free layer/spin filter layer interface in comparison with the free layer/protecting layer interface.

Further, in accordance with this embodiment, when the film thickness of Cu functioning as the spin filter layer SF is changed from 1 nm, the MR is increased until that becomes 20 nm, and is then approximately saturated. Thus, as shown by a dotted line in FIG. 2, it has been found that it is very effective in the MR improvement to set the thickness of the spin filter layer SF to 2 nm or more, desirably 10 nm or more. The film thickness more notable in effect is 5 nm or more and 20 nm or less.

It also appears that one of the reasons for such an improvement of the MR is the improvement of the crystallinity similar to that described in the first embodiment. Namely, in this embodiment, the resistance increasing layer RI including the amorphous insulating portion RIa is inserted into the free layer. Accordingly, the crystallinity of the second free layer F2 formed on the resistance increasing layer RI is apt to be reduced. With respect to this, when the spin filter layer SF including Cu or the like is thickly formed on the second free layer F2, the crystallinity of this spin filter layer SF is improved. It appears that in accordance with this improvement, the crystallinity of the second free layer F2 is also improved. It appears that as a result of the improvement of the crystallinity of the second free layer F2 using an annealing action or a buffering action provided from the spin filter layer SF, its magnetic characteristics are improved, so that the MR is increased.

In this embodiment, equal effects are also obtained when Au, Ag, Pt, Cr, Ti, Zn, Zr, Nb, Pt, Pd, Rh, Ru, Mo, Hf, Ta, and $(Ni_{100-x}Fe_x)_{100-y}Cr_y$ alloy (15<x<25, 20<y<45) are used as the material of the spin filter layer SF in addition to Cu. Further, the similar effect of the MR improvement can be obtained when a laminating structure including a combination of these materials, e.g., a laminating structure including Cu 2 nm/$(Ni_{1-x}Fe_x)_{1-y}Cr_y$ alloy (15<x<25, 20<y<45) 6 nm in the order seen from the free layer F is used.

A material similar to those described in the first embodiment can be used as the material of the insulating portion RIa of the resistance increasing layer RI.

Further, in the following modified example, a similar effect can be achieved. That is, so long as an area of the first free layer F1 adjacent to the spacer layer S in the free layer F is formed of a ferromagnetic material, the other portions of the first free layer F1, the conductive portion RIb and the second free layer F2 may be made of a nonmagnetic material.

Figure 8:
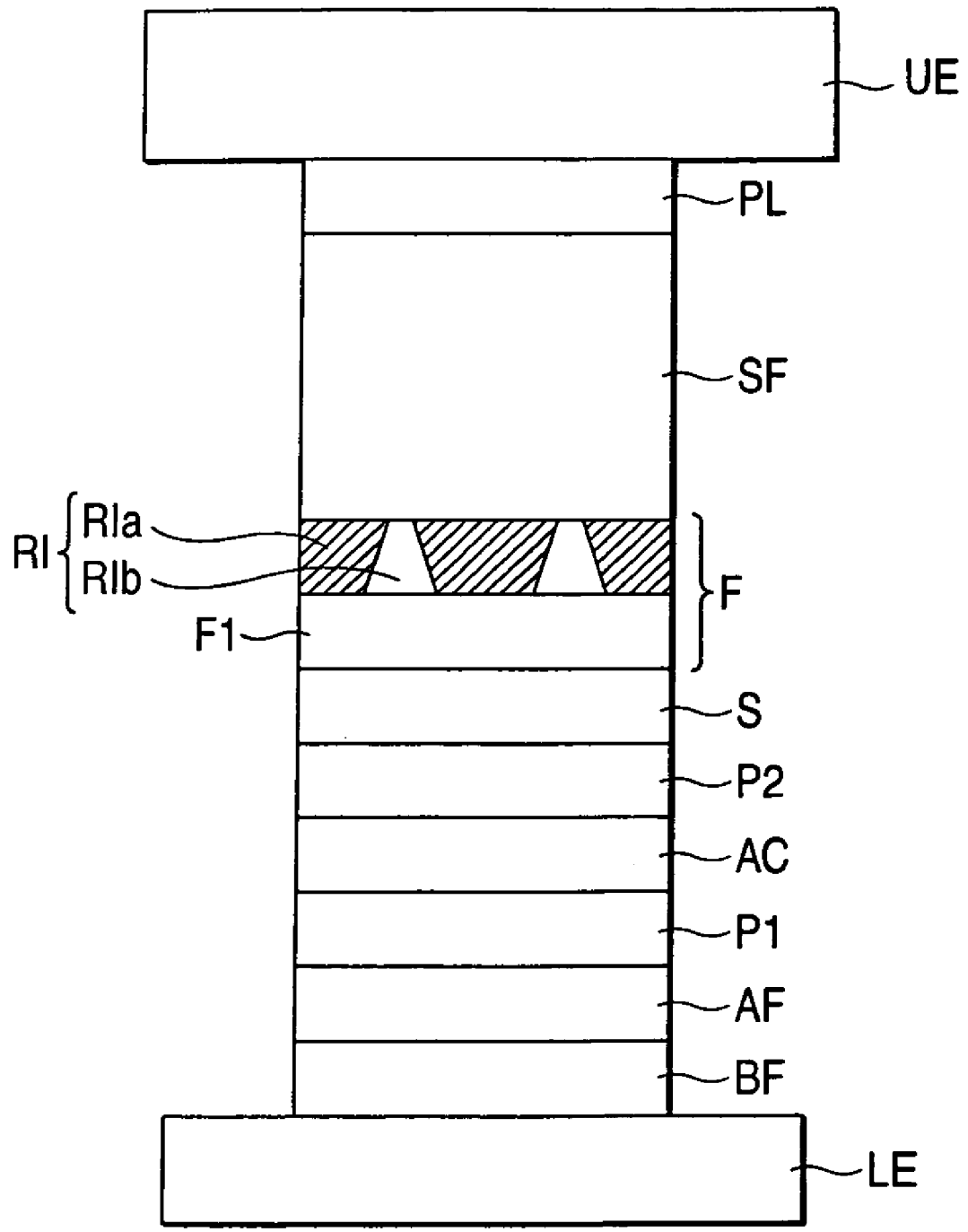
FIG. 8 is a typical sectional view showing a modified example of the second embodiment.
Figure 9:
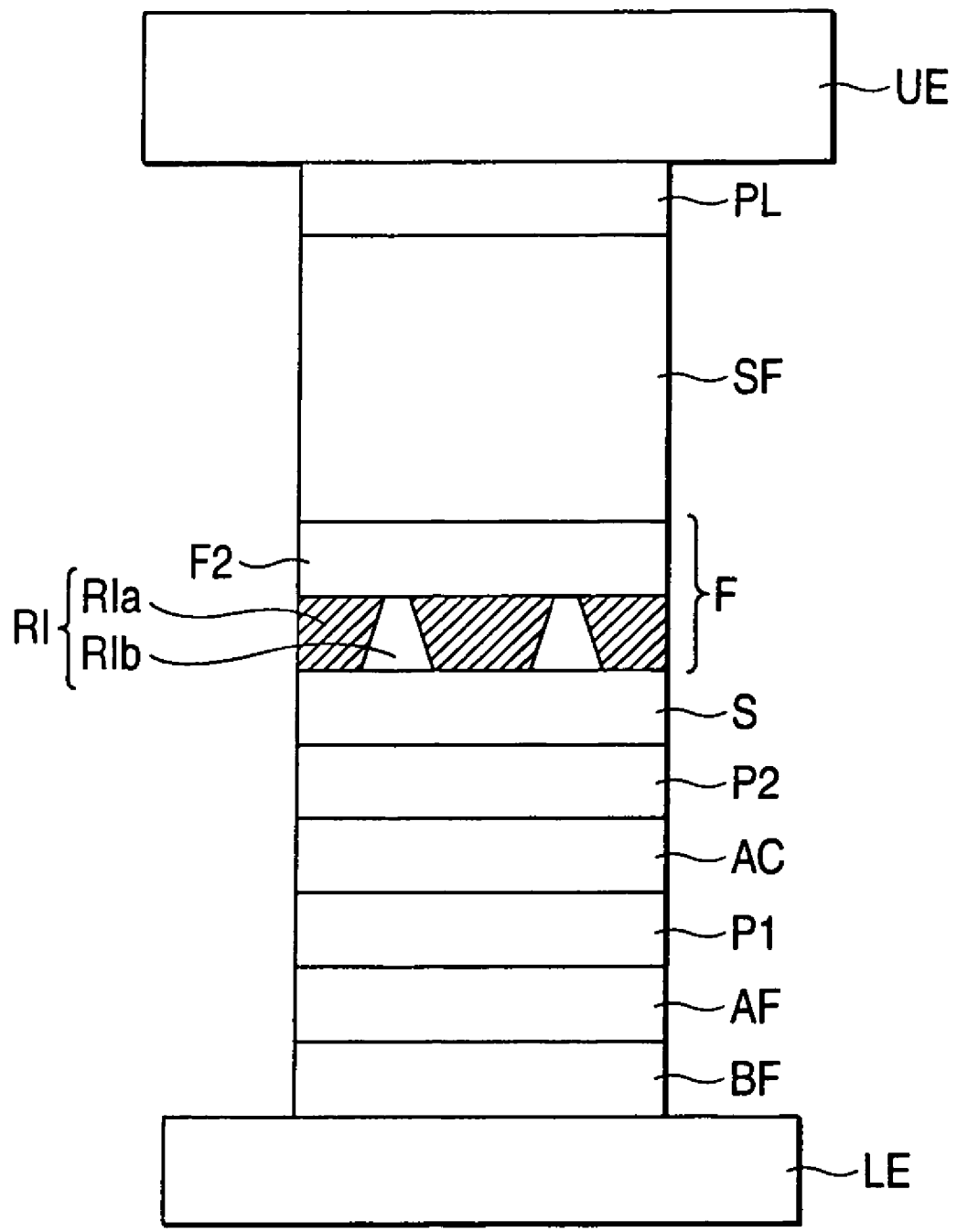
FIG. 9 is a typical sectional view showing a modified example of the second embodiment.
Figure 10:
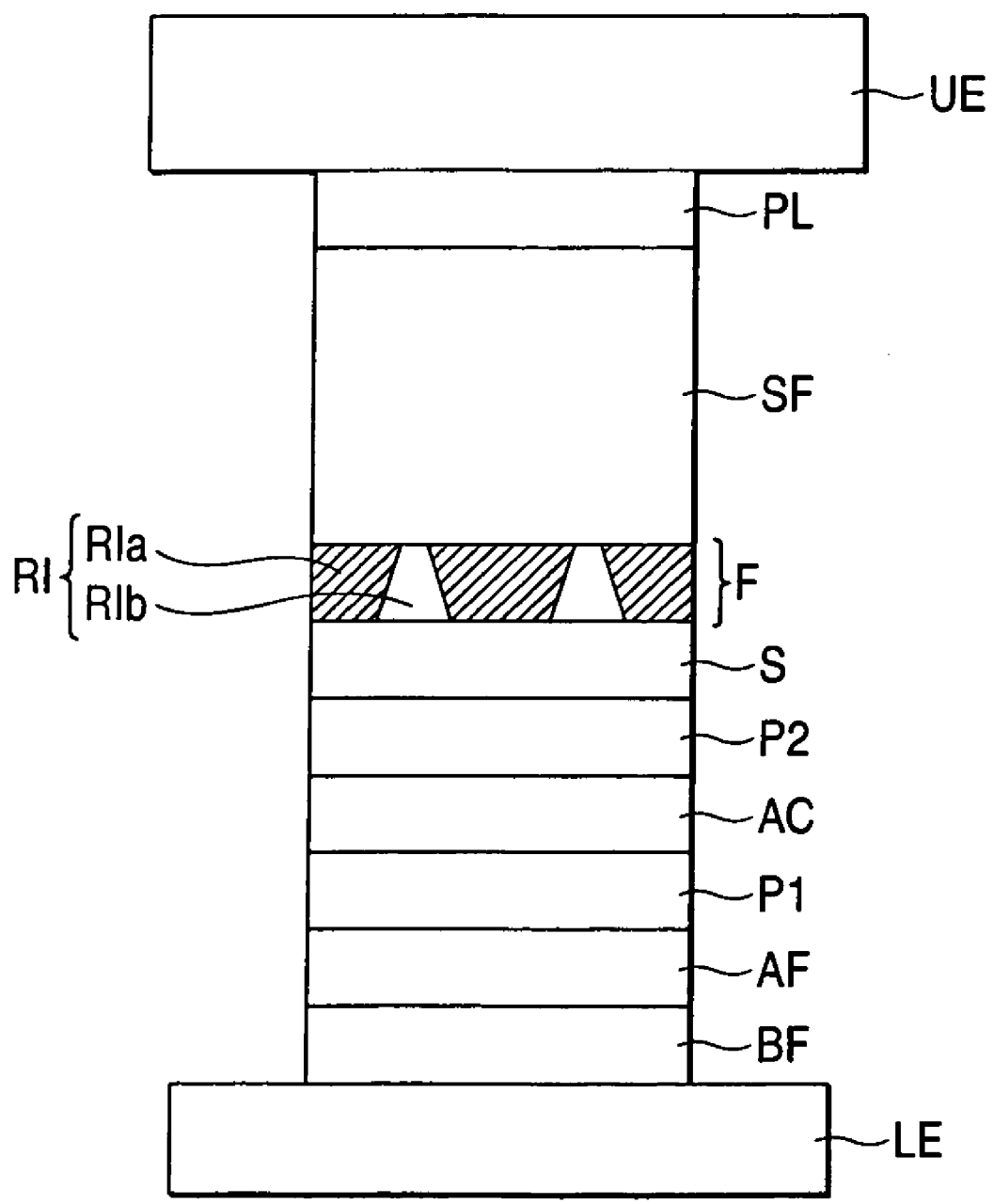
FIG. 10 is a typical sectional view showing a modified example of the second embodiment.

FIGS. 8 to 10 are typical sectional views showing modified examples of this embodiment. In FIGS. 8 to 10, elements similar to those described in FIGS. 1 to 7 are designated by the same reference numerals, and their detailed explanations will be omitted.

Namely, the resistance increasing layer RI in the free layer F may be disposed so as to be adjacent to the spin filter layer SF as shown in FIG. 8, or may be also disposed so as to be adjacent to the spacer layer S as shown in FIG. 9. Otherwise, as shown in FIG. 10, the entire free layer F can be also formed as the resistance increasing layer RI. In this case, the conductive portion RIb is made of a magnetic material, and its magnetization can be rotated in accordance with an external magnetic field. In each of these modified examples, the MR improving effect is obtained by increasing the film thickness of the spin filter layer SF as shown in FIG. 2.

A current is most confined in the conductive portion RIb of the free layer F in the spin valve shown in FIG. 8. Accordingly, of the resistances of layers of the spin valve, the resistance due to the spin-dependent bulk scattering of the conductive portion RIb is most reflected in the MR. However, since the conductive portion RIb exists in the resistance increasing layer, the crystallinity of the conductive portion RIb alone is bad and the spin-dependent bulk scattering factor is reduced. With respect to this, in accordance with this embodiment, when the spin filter layer SF is thickly formed and the crystallinity of the conductive portion RIb adjacent to the spin filter layer SF is improved, the spin-dependent bulk scattering is improved, so that the MR can be increased.

Third Embodiment

Described as a third embodiment of the invention will be a GMR element of the CPP type in which a thick spin filter layer SF is inserted into a spin valve film including a resistance increasing layer in a pinned layer.

Figure 11:
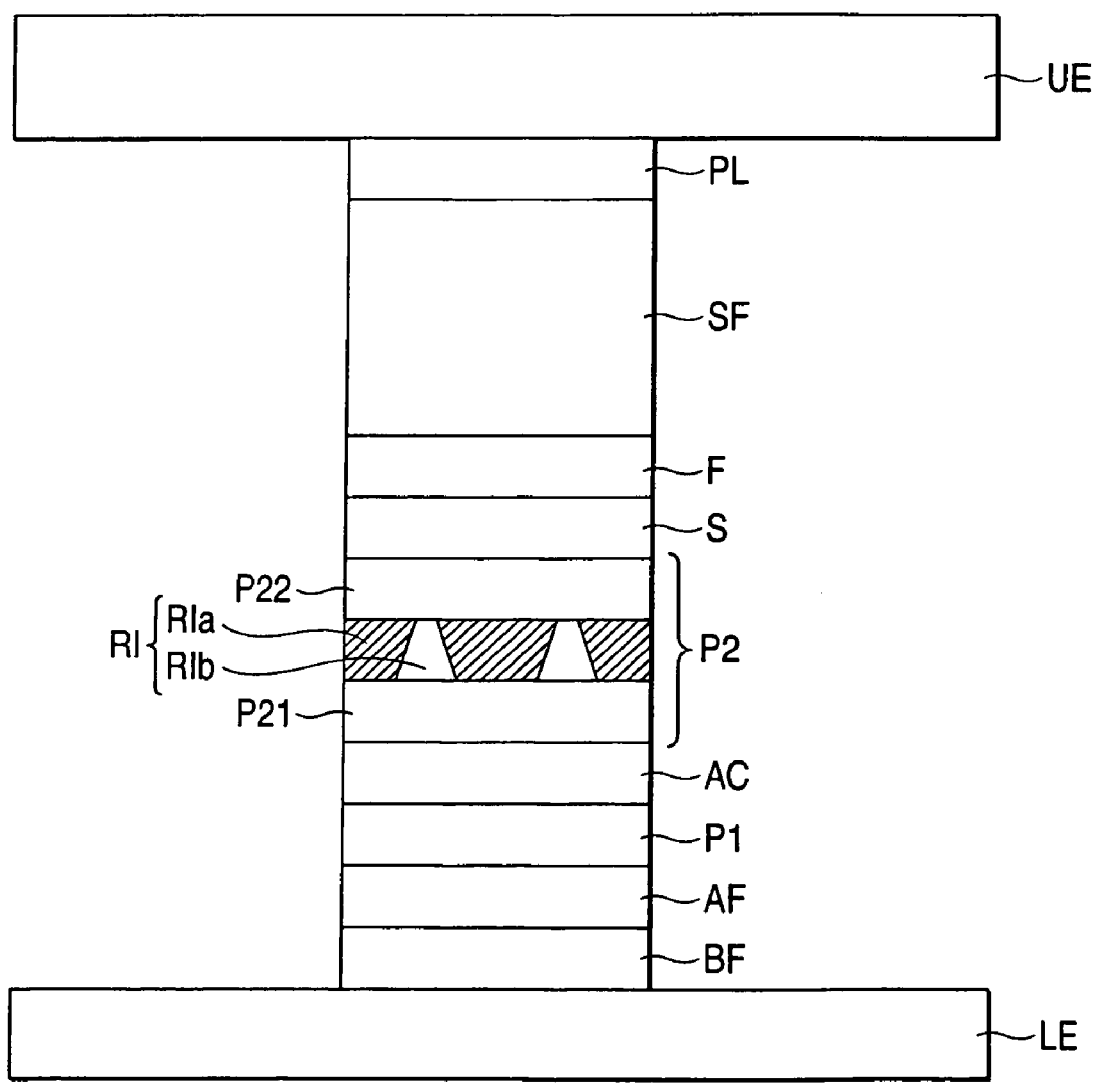
FIG. 11 is a typical view showing the sectional structure of a main portion of a magnetoresistive effect element according to a third embodiment of the invention.

FIG. 11 is a typical view showing the sectional structure of a main portion of the magnetoresistive effect element of this embodiment. In FIG. 11, elements similar to those described with reference to FIGS. 1 to 10 are designated by the same reference numerals and their detailed explanations will be omitted.

The magnetoresistive effect element of this embodiment also has a spin valve structure including a pinned layer P, a free layer F and a spacer layer S disposed therebetween. Each of these layers has a function as mentioned in the first embodiment. However, in this embodiment, the second pinned layer P2 includes a first layer P21, a second layer P22 and a resistance increasing layer RI disposed therebetween. The first and second layers P21, P22 includes a magnetic material and includes a ferromagnetic film changeable in magnetization in accordance with an external magnetic field.

On the other hand, similar to the first embodiment, the resistance increasing layer RI has an insulating portion RIa and an conductive portion RIb approximately extending through a portion of the insulating portion RIa in the thickness direction. The conductive portion RIb is made of a ferromagnetic material. Ohmic contacts are formed between the resistance increasing layer R (the conductive portion RIb) and the first and second layers P21, P22. Namely, the resistance increasing layer RI increases the electric resistance of the magnetoresistive effect element and the conduction of a sense current in the direction perpendicular to the film face is secured through the conductive portion RIb of the resistance increasing layer RI.

In this magnetoresistive effect element, sample were made in the following order seen from the lower electrode LE. The buffer layer BF was to Ta 5 nm/Ru 2 nm. The antiferromagnetic layer AF was PtMn 15 nm. The first pinned layer P1 was $Co_{90}Fe_{10}$ 3 nm. The magnetization antiparallel coupling layer AC was Ru 1 nm. The second pinned layer P2 was $Co_{90}Fe_{10}$ 2 nm (first layer 21)/$Co_{90}Fe_{10}$–O 1 nm (insulating portion RIa of the resistance increasing layer RI) and $Co_{90}Fe_{10}$ (conductive portion RIb of the resistance increasing layer RI)/$Co_{90}Fe_{10}$ 1 nm (second layer 22). The spacer layer S was Cu 5 nm. The free layer F was $Co_{90}Fe_{10}$ 1 nm/$Ni_{80}Fe_{20}$ 3.5 nm. The spin filter layer SF was Cu 0 nm to 50 nm. The protecting layer PL was Ta 20 nm.

The MR of these samples are shown as "Example 3" in FIG. 2.

When there is no spin filter layer SF (film thickness is zero nm) as shown in FIG. 2, the MR is 3.6%. In contrast to this, when the Cu layer of 1 nm in thickness is disposed, it has been found that the MR is raised to 3.8%. It is also considered that the reason for this MR improvement is an interface effect due to the insertion of the spin filter layer SF as described in the first and second embodiments. Namely, it appears that the MR is increased since the spin-dependent interface scattering is increased at the free layer/spin filter layer interface in comparison with the free layer/protecting layer interface.

Further, in accordance with this embodiment, when the Cu film thickness functioning as the spin filter layer SF is changed from 1 nm, the MR is increased until the Cu film becomes about 5 nm, and is then approximately saturated. Thus, as shown by a dotted line in FIG. 2, it has been found that it is very effective in the MR improvement to set the thickness of the spin filter layer SF to 2 nm or more, desirably 5 nm or more.

It also appears that one of the reasons for such an improvement of the MR is the improvement of the crystallinity similar to that described in the first and second embodiments. Namely, in this embodiment, the resistance increasing layer RI including the amorphous insulating portion RIa is inserted into the second pinned layer P2. Accordingly, the crystallinity of the second layer P22, that of the spacer layer S and that of the free layer F formed on the resistance increasing layer RI are apt to be reduced. With respect to this, when the spin filter layer SF including Cu or the like is thickly formed on the free layer F, the crystallinity of this spin filter layer SF is improved. It appears that in accordance with this improvement, the crystallinity of the free layer F, etc. are also improved. It also appears that as a result of the improvement of the crystallinity of the free layer F, etc. using an annealing action or a buffering action provided from the spin filter layer SF, its magnetic characteristics are improved, so that the MR is increased.

In this embodiment, equal effects are also obtained when Au, Ag, Pt, Cr, Ti, Zn, Zr, Nb, Pt, Pd, Rh, Ru, Mo, Hf, Ta, and Ni—Fe—Cr alloy are used as the material of the spin filter layer SF in addition to Cu. Further, similar effects are obtained when a laminating structure having a combination of these materials, e.g., a laminating structure including a combination of Cu 2 nm/Cr 5 nm, etc. is used.

Figure 12:
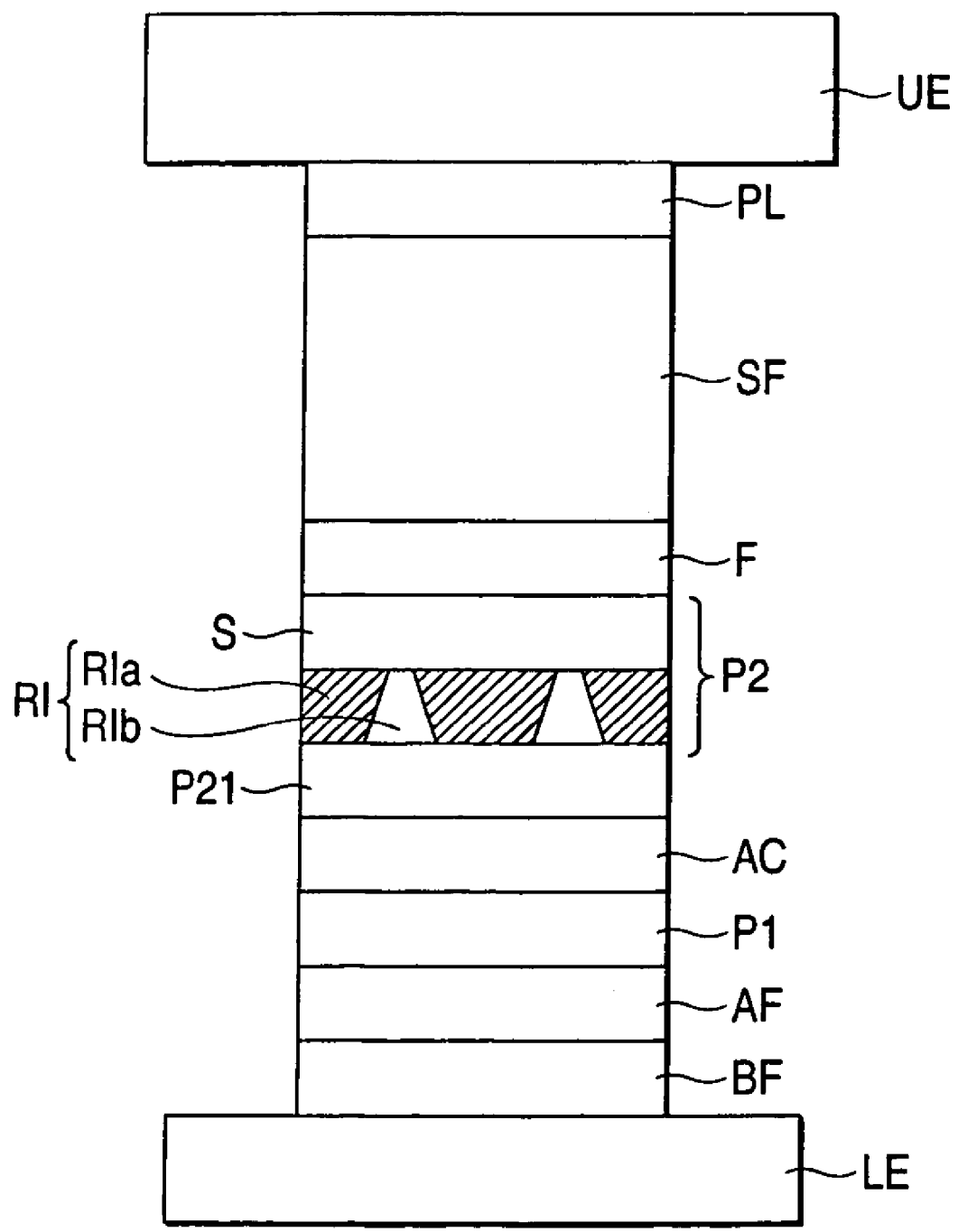
FIG. 12 is a typical sectional view showing a modified example of the third embodiment.
Figure 13:
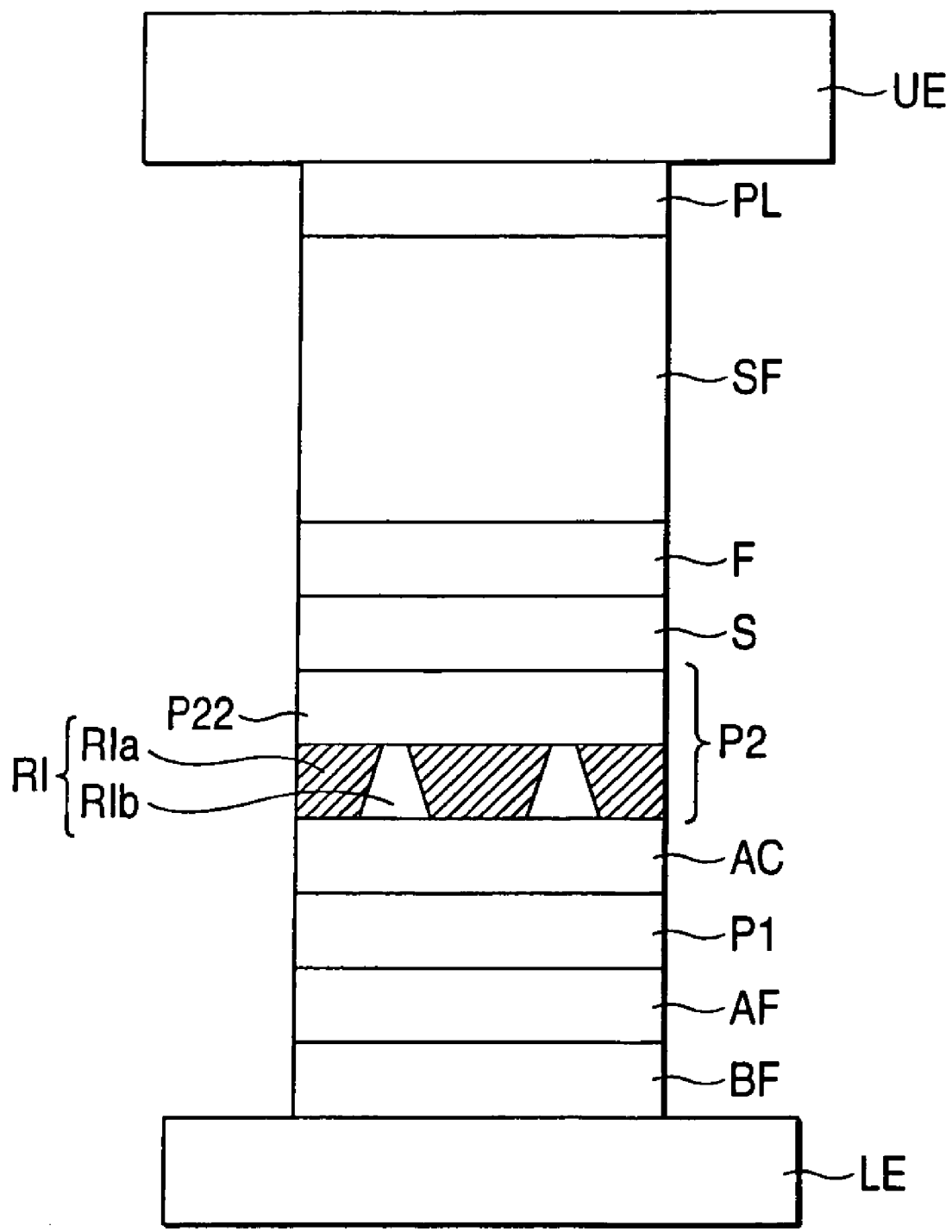
FIG. 13 is a typical sectional view showing a modified example of the third embodiment.
Figure 14:
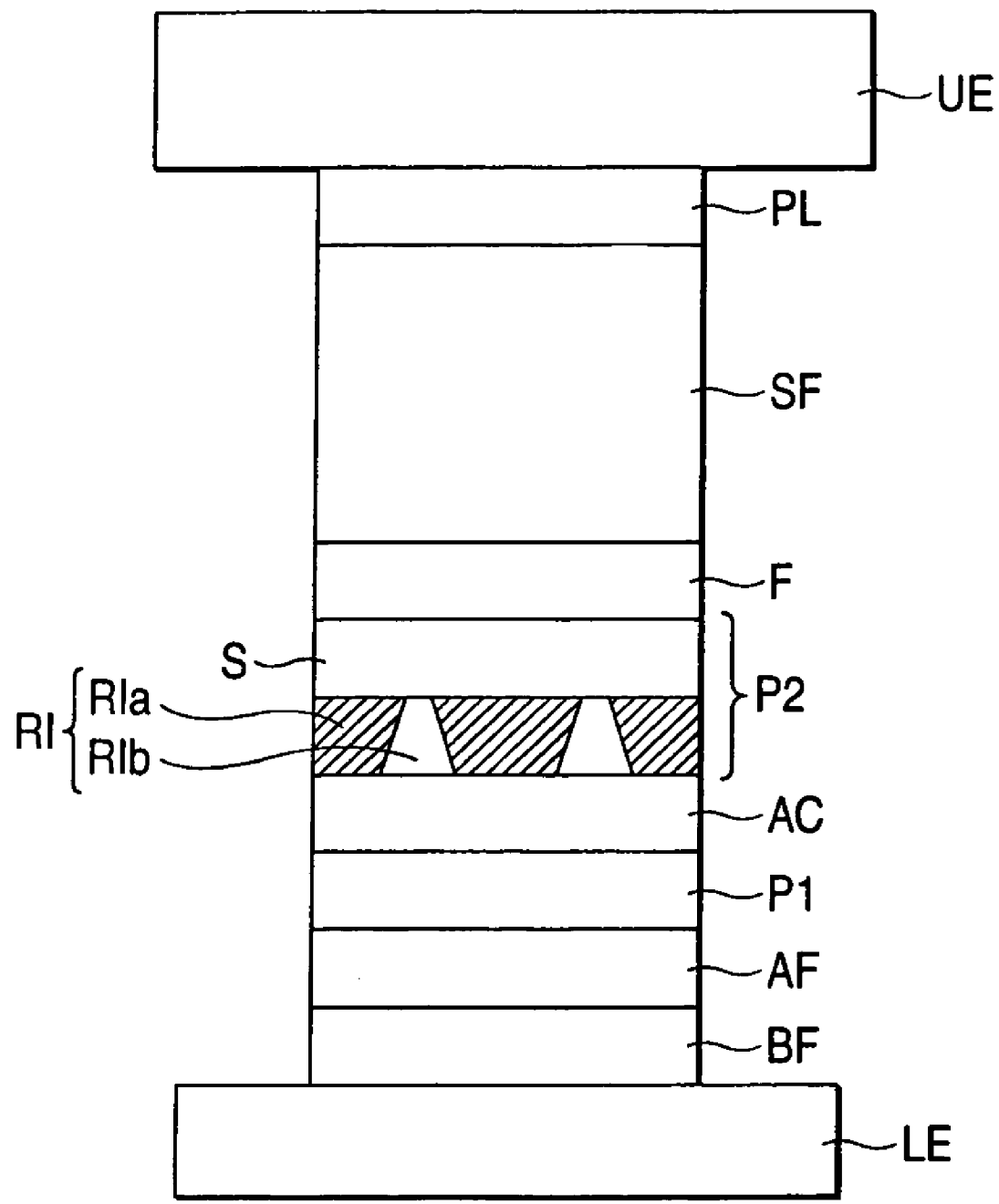
FIG. 14 is a typical sectional view showing a modified example of the third embodiment.

FIGS. 12 to 14 are typical sectional views showing modified examples of this embodiment. In FIGS. 12 to 14, elements similar to those shown in FIGS. 1 to 11 are designated by the same reference numerals, and their detailed explanations will be omitted.

Namely, the resistance increasing layer RI in the second pinned layer P2 may be also arranged to be disposed to the spacer layer S as shown in FIG. 12, or may be also disposed so as to adjacent to the magnetization antiparallel coupling layer AC as shown in FIG. 13. Otherwise, as shown in FIG. 14, the entire second pinned layer P2 can be also formed as the resistance increasing layer RI. In this case, the conductive portion RIb is made of a magnetic material, and its magnetization is pinned to the direction opposed to that of the first pinned layer P1 due to the action of the magnetization antiparallel coupling layer AC.

In each of these modified examples, the MR improving effect is obtained by increasing the film thickness of the spin filter layer SF as shown in FIG. 2.

Fourth Embodiment

The magnetoresistive effect element including the spin filter layer SF that has a laminating structure will next be described as a fourth embodiment of the invention.

Figure 15:
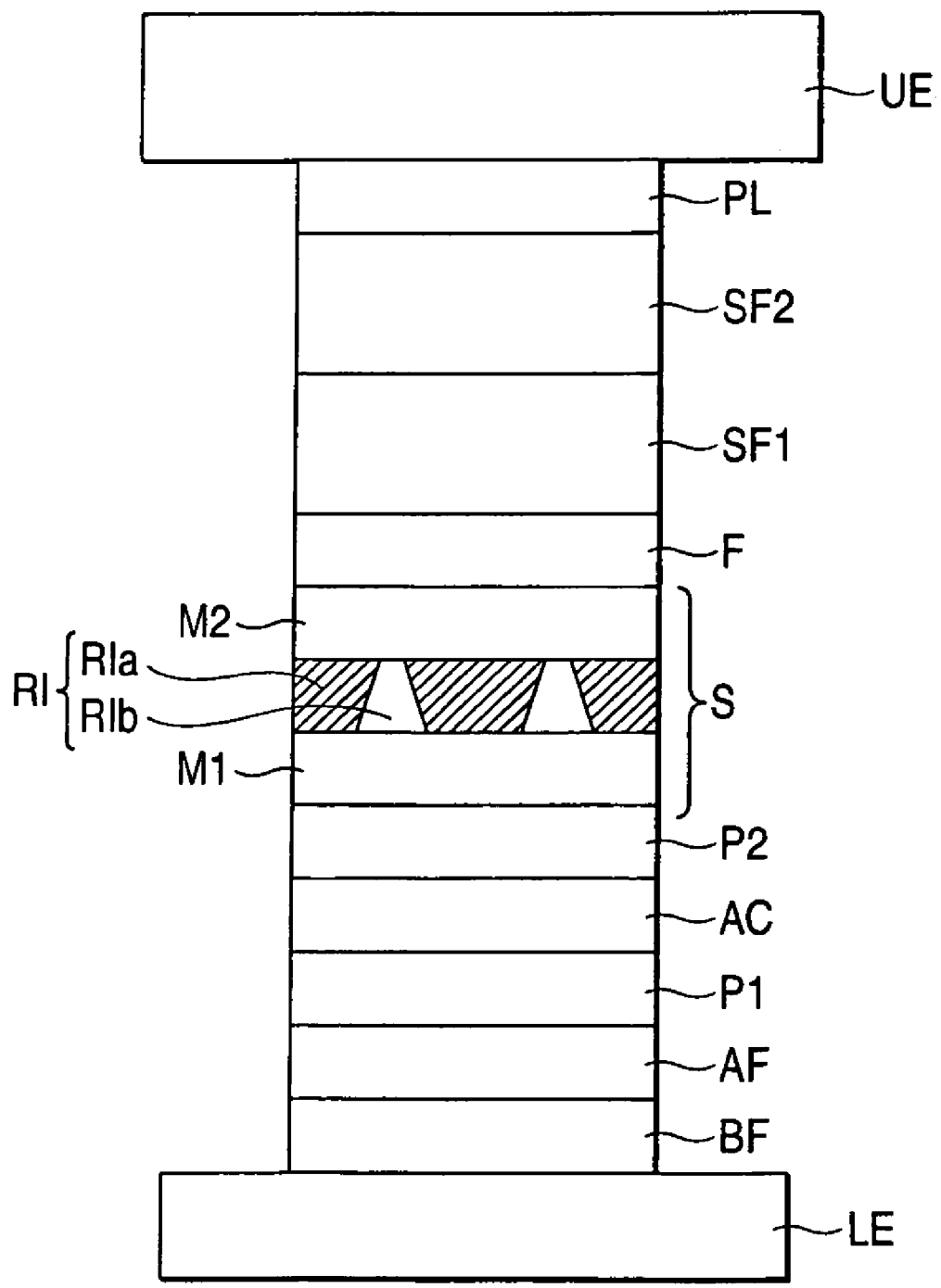
FIG. 15 is a typical view showing a sectional structure of the magnetoresistive effect element in which a spin filter layer SF has a laminating structure.

FIG. 15 is a typical view showing the sectional structure of the magnetoresistive effect element in which the spin filter layer SF has a laminating structure.

Namely, this specific example has a structure similar to that in the first embodiment. However, the spin filter layer SF has a laminating structure of a first spin filter layer SF1 and a second spin filter layer SF2. These first and second spin filter layers SF1, SF2 may be made of a nonmagnetic metal.

In this embodiment, the following results are obtained when the combination of the spin filter layer SF1 adjacent to the free layer F and the spin filter layer SF2 adjacent to the protecting layer is changed.

TABLE 1

| Sample number | Spin filter layer | | MR [%] | Remarks |
|---|---|---|---|---|
| 1 | Cu 1 nm | | 4.0 | Embodiment 1 |
| 2 | Cu 10 nm | | 5.0 | Embodiment 1 |
| 3 | Ru 10 nm | | 4.1 | |
| 4 | $(Ni_{80}Fe_{20})_{78}Cr_{22}$ 10 nm | | 4.8 | |
| | spin filter layer 1 | spin filter layer 2 | | |
| 5 | Cu 3 nm | Ru 7 nm | 4.8 | |
| 6 | Cu 3 nm | $(Ni_{80}Fe_{20})_{78}Cr_{22}$ 7 nm | 5.3 | |

Sample numbers 1 to 4 show results when the spin filter layer SF has a single layer. The spin filter layer made of Ru (ruthenium) used in the sample number 3 has an effect for improving the crystal orientation, but MR is not easily improved since the interface between this spin filter layer and the free layer F (Ni80Fe20) has a negative spin-dependent scattering factor. On the contrary, the MR is improved when the spin filter layer has a structure (sample number 5) in which a layer including Cu having a large positive spin-dependent interface scattering factor is disposed on a side adjacent to the free layer F as the spin filter layer SF1 and Ru is used as the spin filter layer SF2.

In the spin filter layer formed of $(Ni_{80}Fe_{20})_{78}Cr_{22}$ used in the sample number 4, the spin-dependent interface scattering is not negative, but is inferior to the value of the spin-dependent interface scattering obtained at the $Ni_{80}Fe_{20}$/Cu interface. Therefore, this spin filter layer of the sample number 4 is slightly insufficient in the MR in comparison with the sample number 2 that adopts the spin filter layer formed of Cu of 10 nm in thickness. If the structure of this embodiment is adopted and Cu is used in the spin filter layer SF1 and $(Ni_{80}Fe_{20})_{78}Cr_{22}$ is used in the spin filter layer SF2, the spin-dependent interface scattering and the crystallinity improvement are compatible, so that high MR can be obtained.

Thus, when the spin filter layer SF has a multi layer structure and functions born in each layer are distributed, a further MR improvement can be realized. It is similarly considered that a further excellent effect is obtained even when the spin filter layer is a laminating film of three layers or more.

A similar effect can be obtained when this embodiment is applied to the spin valve structures of the second or third embodiments.

Fifth Embodiment

A magnetoresistive effect element having plural resistance increasing layers RI will next be described as a fifth embodiment of the invention.

Namely, in the above first to fourth embodiments, the MR is improved by disposing the thick spin filter layer SF in the spin valve structure in which the resistance increasing layer RI is inserted into one of the spacer layer S, the free layer F and the second pinned layer P2.

Figure 16:
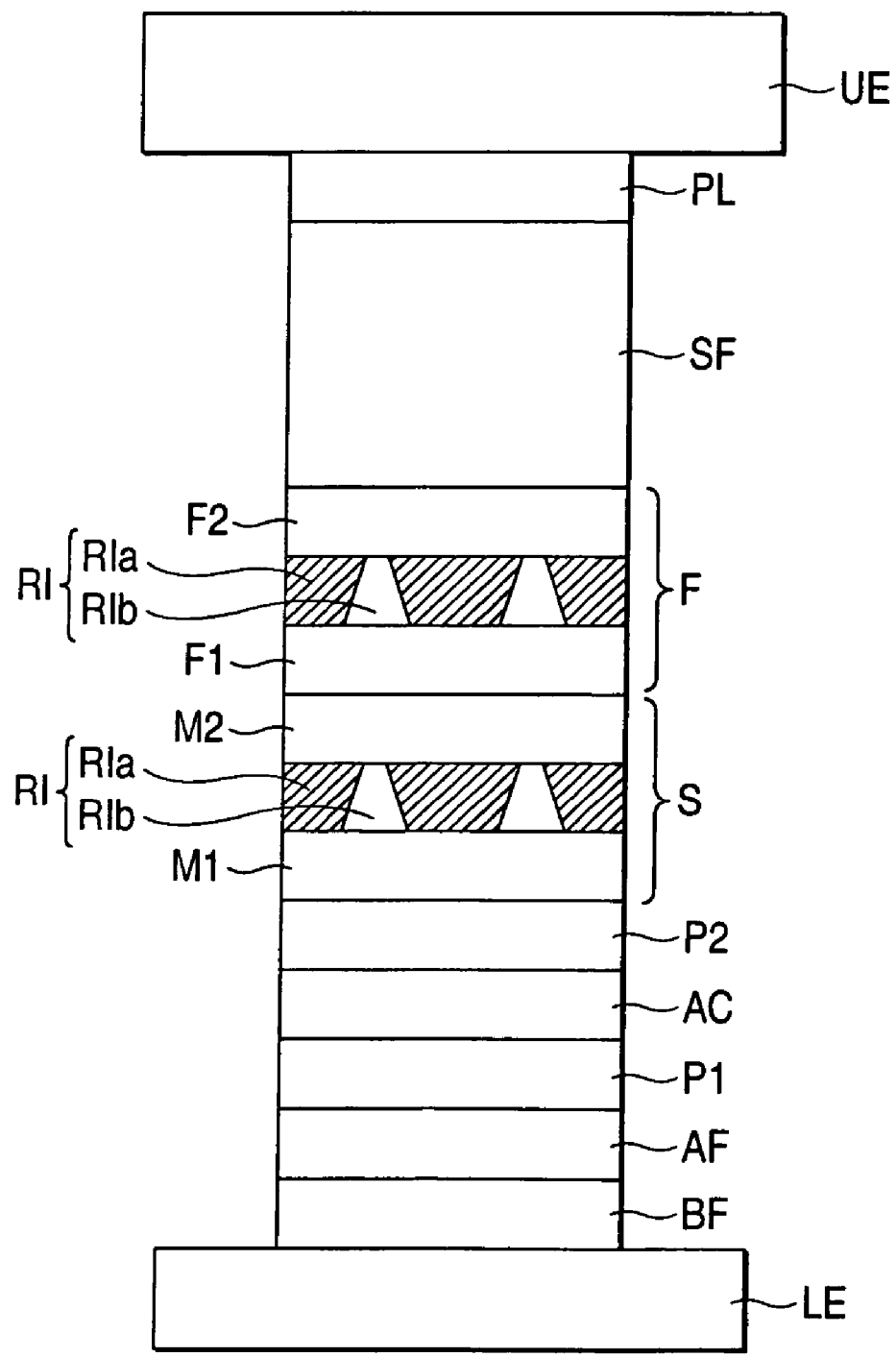
FIG. 16 is a typical view showing a spin valve structure in which a resistance increasing layer RI is inserted into each of a spacer layer S and a free layer F.

However, the invention is not limited to this case. For example, the invention includes a case where the first to third embodiments are desirably combined. For example, as shown in FIG. 16, in a case where the spin valve structure has the resistance increasing layers RI inserted into the spacer layer S and the free layer F, respectively, the MR can be also improved by providing the thick spin filter layer.

Figure 17:
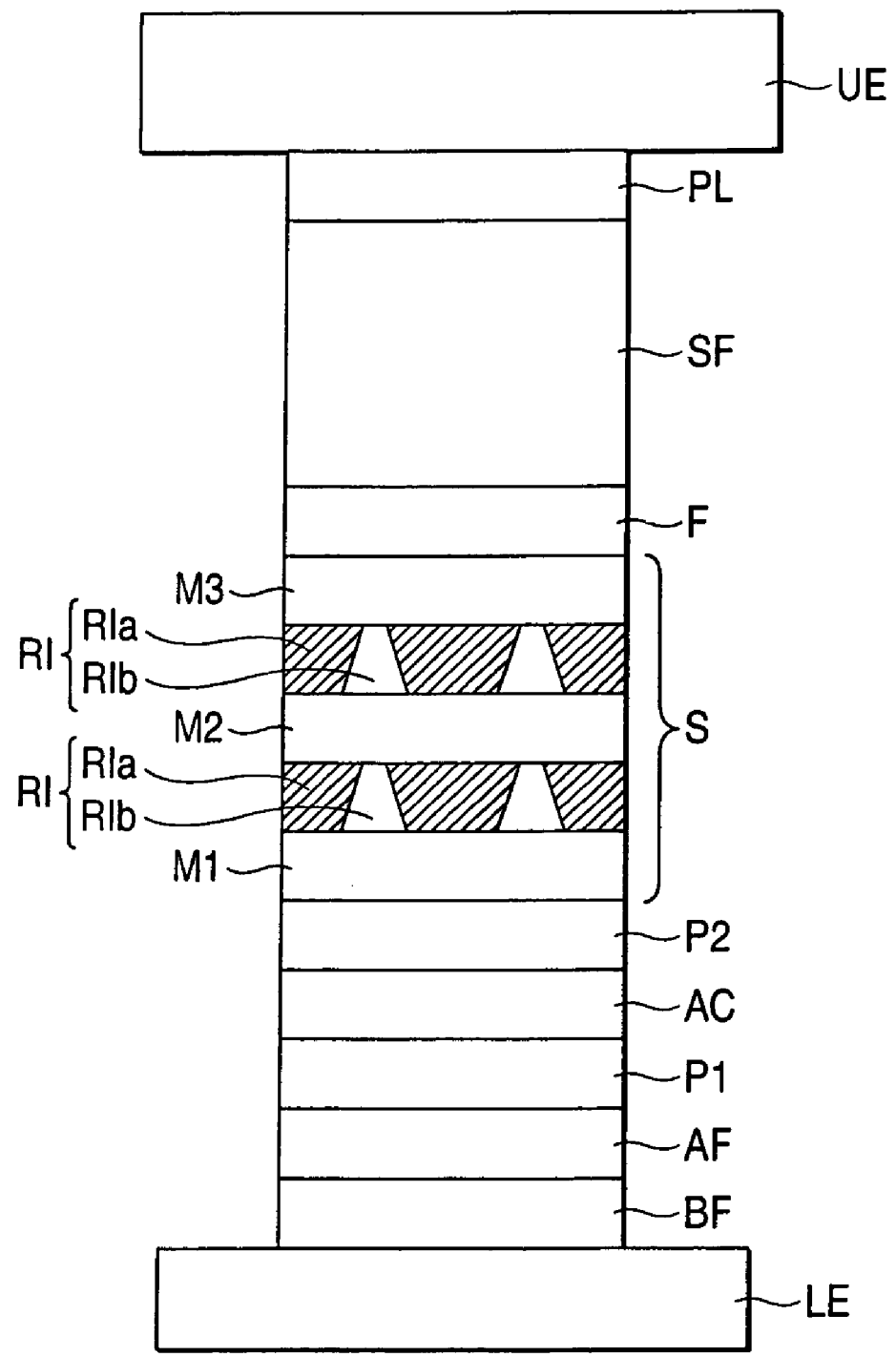
FIG. 17 is a typical view showing a spin valve structure in which two resistance increasing layers RI are provided in the spacer layer S.

Further, in a case where the spin valve structure has two or more resistance increasing layers RI inserted into one of the spacer layer S, the free layer F, and the second pinned layer P2, the MR can be also improved by providing the thick spin filter layer. For example, as shown in FIG. 17, two resistance increasing layers RI may be disposed in the spacer layer S.

Sixth Embodiment

Described as a sixth embodiment of the invention will be a magnetoresistive effect element in which the laminating order of the pinned layer and the free layer is inverted. Namely, in a case where the laminating order of the spin valve filter is inverted as shown in FIG. 18, the effects described in the first to fifth embodiments also can be obtained.

Figure 18:
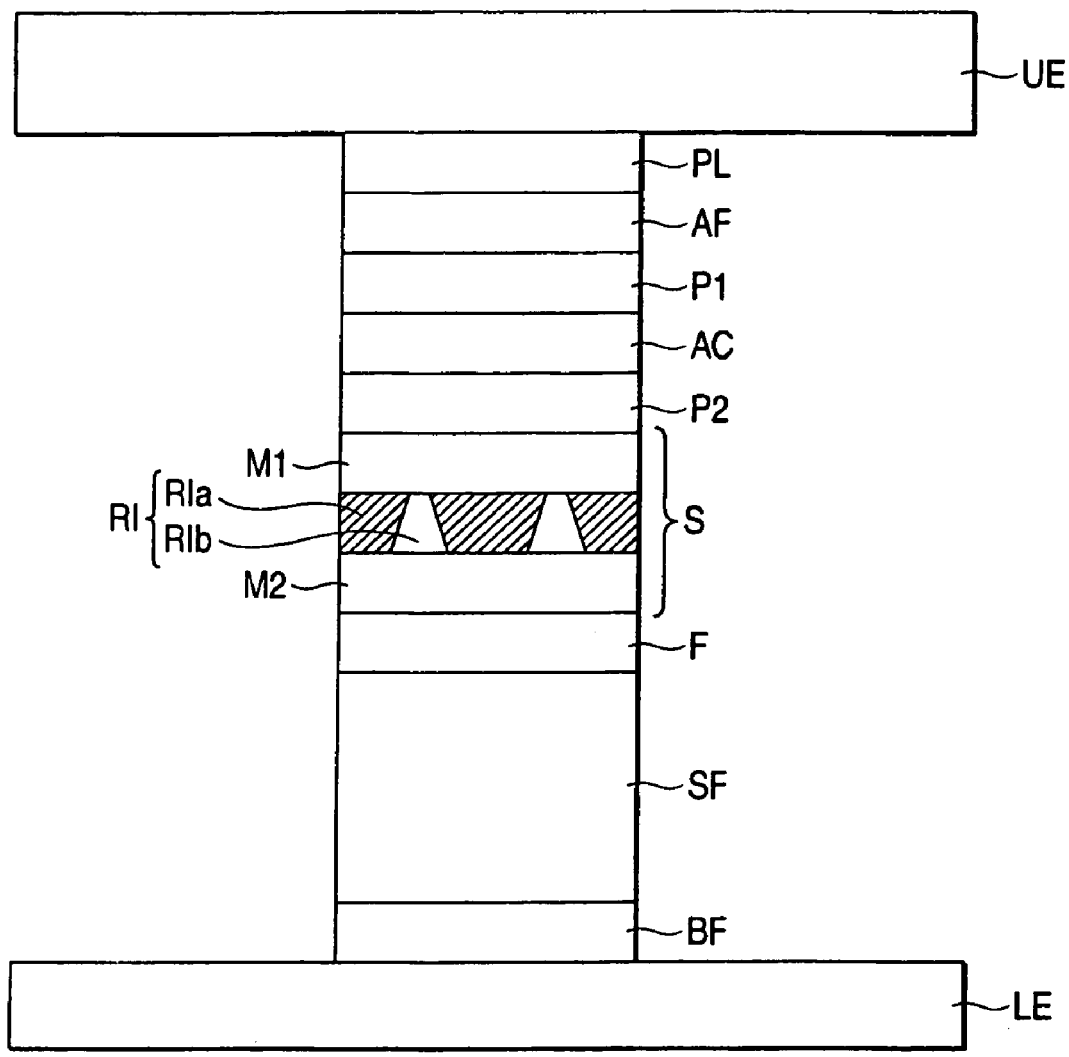
FIG. 18 is a typical view showing a concrete example in which the laminating order of a spin valve film is inverted.

Namely, in the magnetoresistive effect element shown in FIG. 18, the spin filter layer SF is first disposed above the lower electrode EL through the buffer layer BF. The free layer F, the spacer layer S, the pinned layer P, the antiferromagnetic layer AF, the protecting layer PL and the upper electrode UE are sequentially laminated on this spin filter layer SF. When the thick spin filter layer SF is provided in the spin valve structure of such a laminating order, the crystallinity of the free layer F, etc. formed on the spin filter layer SF is improved, magnetic characteristics are improved, so that high MR can also be obtained.

Further, in this embodiment, the effect of the resistance increase can be obtained by disposing the resistance increasing layer RI in at least one of the spacer layer S, the free layer F and the second pinned layer P2.

Seventh Embodiment

A specific example of the magnetoresistive effect element of the CPP type will next be described as a seventh embodiment of the present invention.

Figure 19:
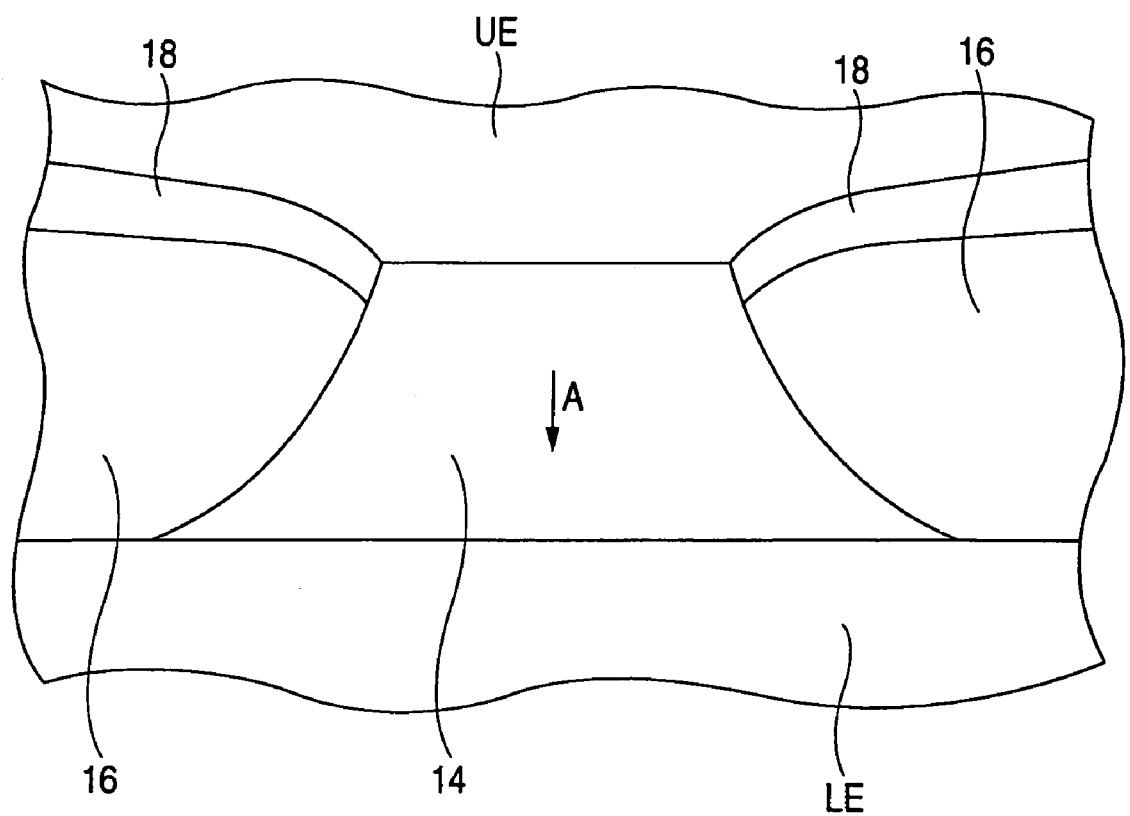
FIG. 19 is a schematic view typically showing a configuration of a main portion of the magnetoresistive effect element according to an embodiment of the invention.
Figure 20:
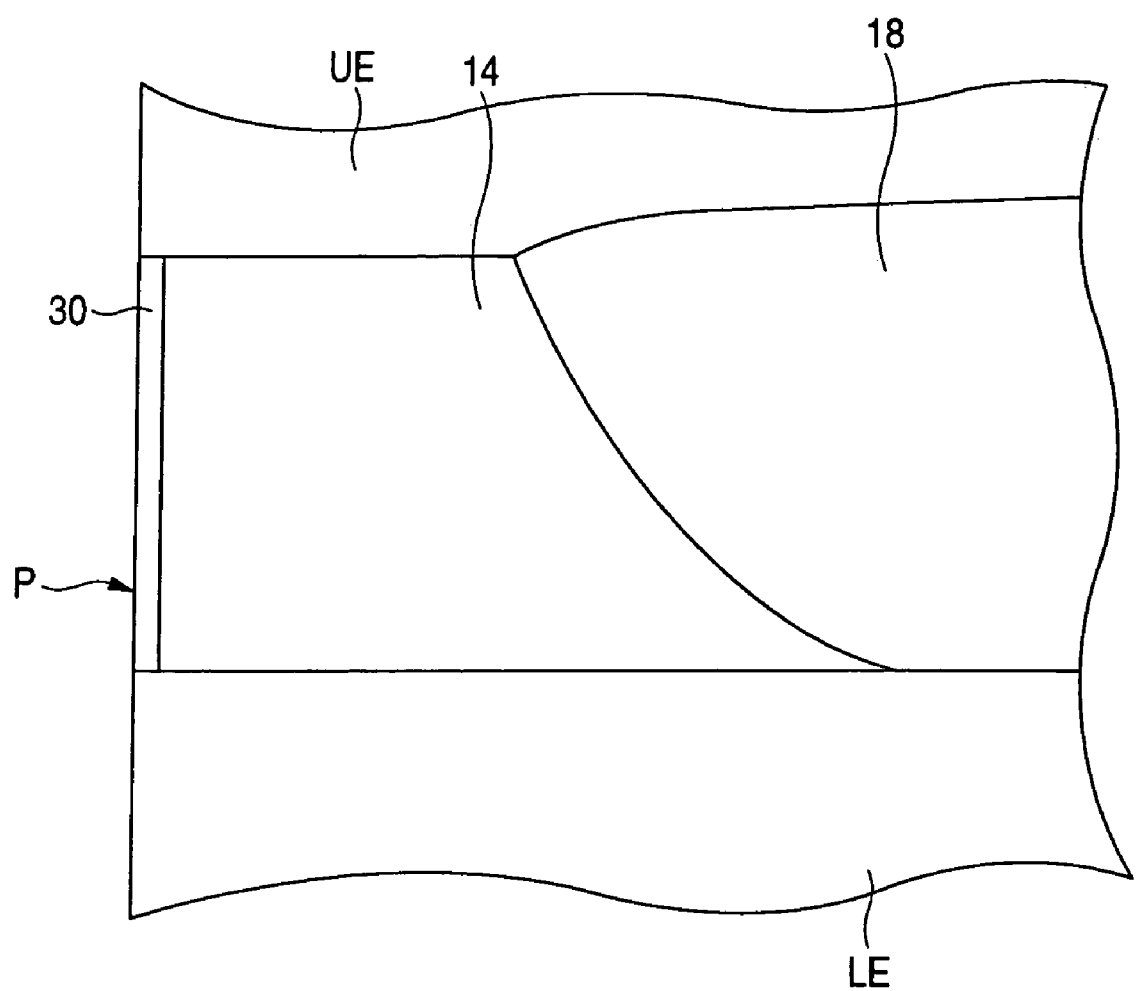
FIG. 20 is a schematic view typically showing a configuration of a main portion of the magnetoresistive effect element according to the embodiment of the invention.

FIGS. 19 and 20 are schematic views typically showing a configuration of a main portion of the magnetoresistive effect element according to a seventh embodiment of the invention. Namely, FIGS. 19 and 20 show states where the magnetoresistive effect element is assembled into a magnetic head. FIG. 19 is a section view in which the magnetoresistive effect element is cut in a direction approximately parallel to a medium-facing surface P that faces a not-shown magnetic recording medium. FIG. 20 is a section view in which this magnetoresistive effect element is cut in a direction perpendicular to the medium-facing surface P.

The magnetoresistive effect element shown in FIGS. 19 and 20 is one having a hard abutted structure. The lower electrode LE and the upper electrode UE are respectively disposed above and below a magnetoresistive effect film 14. Further, in FIG. 19, a bias magnetic field application film 16 and an insulating film 18 are laminated and disposed on both side surfaces of the magnetoresistive effect film 14. Further, as shown in FIG. 20, the protecting film 30 is disposed on the medium-facing surface of the magnetoresistive effect film 14.

As mentioned above with respect to FIGS. 1 to 18, the magnetoresistive effect film 14 has a structure according to the embodiment of the invention. Namely, the magnetoresistive effect film 14 has a laminating structure for obtaining a high absolute value of resistance and a large magnetoresistive effect by providing the resistance increasing layer RI and the thick spin filter layer SF.

The sense current with respect to the magnetoresistive effect film 14 is flowed in a direction approximately perpendicular to the film face, as shown by an arrow A, by the electrodes LE, UE disposed above and below the magnetoresistive effect film 14. Further, a bias magnetic field is applied to the magnetoresistive effect film 14 by a pair of bias magnetic field application films 16, 16 disposed leftward and rightward. When magnetic anisotropy of the free layer of the magnetoresistive effect film 14 is controlled to form a single magnetic domain using the bias magnetic field, the magnetic-domain structure is stabled and the Barkhausen noise caused by the movement of a magnetic wall can be suppressed.

In accordance with the embodiment, the absolute value of resistance is high and a large magnetoresistive effect is obtained by providing the resistance increasing layer and the thick spin filter layer SF in the magnetoresistive effect film 14. As a result, the sensitivity of the magnetoresistive effect element can be notably improved. For example, when the magnetoresistive effect element is applied to the magnetic head, magnetic reproduction of high sensitivity can be performed.

Eighth Embodiment

A magnetic reproducing apparatus mounting the magnetoresistive effect element according to the preceding embodiments of the invention will next be described as an eighth embodiment of the invention. Namely, for example, the magnetoresistive effect element or the magnetic head of the preceding embodiment described with reference to FIGS. 1 to 20 is assembled into a magnetic head assembly of a record-reproduction integral type, and can be mounted to the magnetic-record reproducing apparatus.

Figure 21:
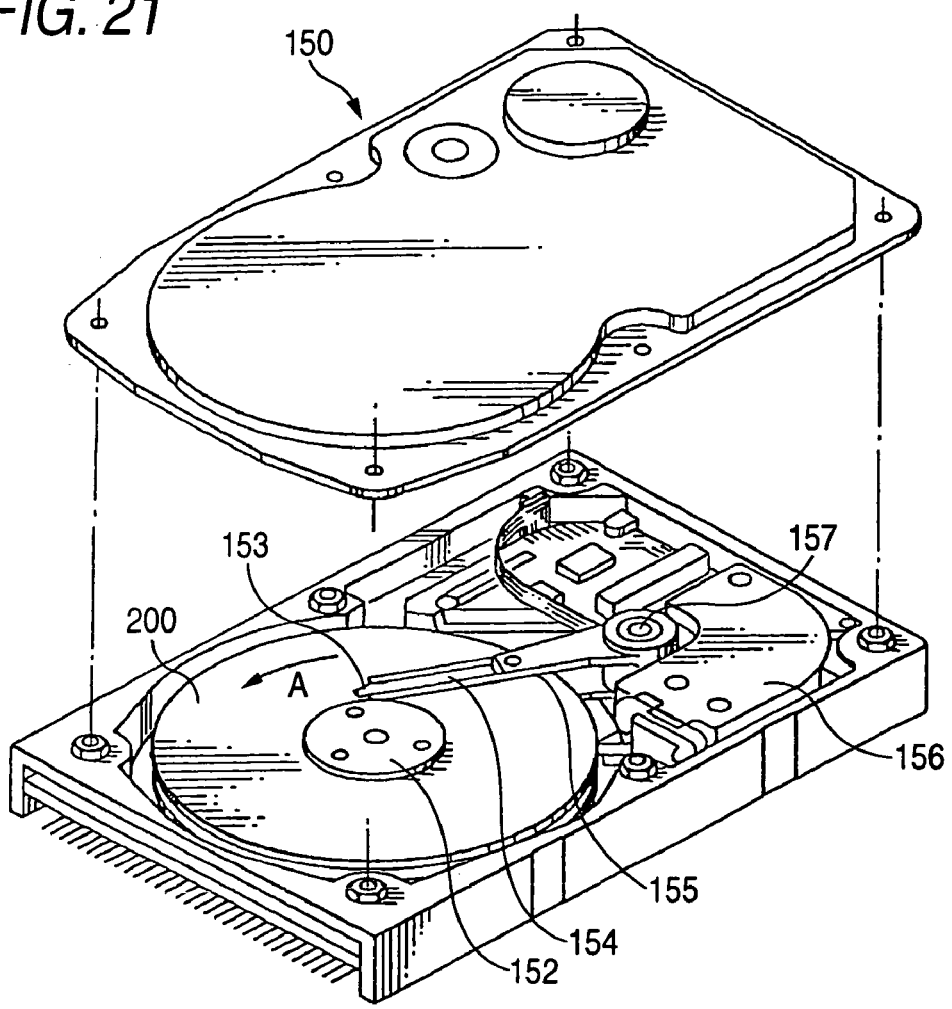
FIG. 21 is a perspective view of a main portion showing a schematic configuration of a magnetic-record reproducing apparatus according to an embodiment of the invention.

FIG. 21 is a perspective view of a main portion for showing a schematic configuration of the magnetic-record reproducing apparatus. Namely, the magnetic-record reproducing apparatus 150 according to this embodiment is a device using a rotary actuator. In FIG. 21, a medium disk 200 for record is mounted to a spindle 152, and is rotated in a direction of an arrow A by an not-shown motor responsive to a control signal from an not-shown drive unit control section. The magnetic-record reproducing apparatus 150 of this embodiment may also have plural medium disks 200.

A head slider 153 for recording and reproducing information stored in the medium disk 200 is attached to the tip of a suspension 154 of a thin film shape. Here, for example, the magnetoresistive effect element or the magnetic head in accordance with one of the above embodiments is mounted at a portion near the tip of the head slider 153.

When the medium disk 200 is rotated, a medium-facing surface (ABS) of the head slider 153 is held with a predetermined floating amount from the surface of the medium disk 200. Otherwise, a so-called "contact running type" in which a slider is in contact with the medium disk 200 may be also used.

The suspension 154 is connected to one end of an actuator arm 155 having a bobbin portion for holding an not-shown driving coil, etc. A voice coil motor 156, which is one kind of a linear motor, is provided at the other end of the actuator arm 155. The voice coil motor 156 includes a not-shown driving coil taken up around the bobbin portion of the actuator arm 155, and a magnetic circuit including a permanent magnet and facing yoke that are disposed to face each other and to sandwich the coil.

The actuator arm 155 is held by not-shown ball bearings disposed at two upper and lower portions of the spindle 157, and can be freely rotated and slid by the voice coil motor 156.

Figure 22:
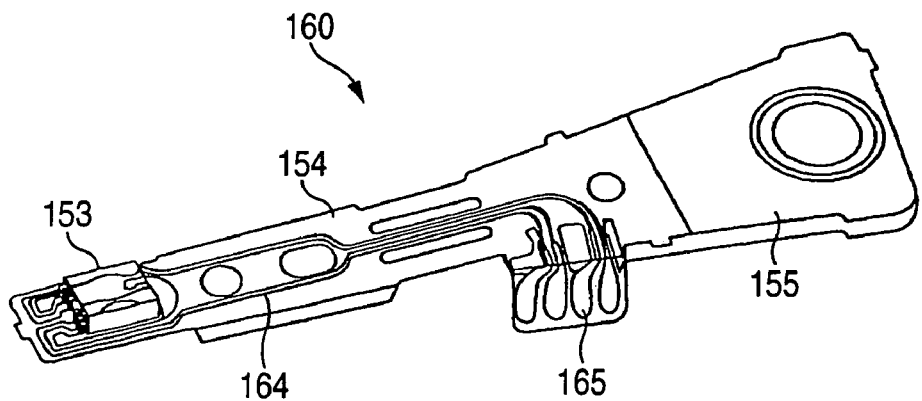
FIG. 22 is an enlarged perspective view in which a magnetic head assembly ahead of an actuator arm 155 is seen from the side of a disk.

FIG. 22 is an enlarged perspective view in which the magnetic head assembly ahead of the actuator arm 155 is seen from the disk side. Namely, for example, the magnetic head assembly 160 has the actuator arm 155 having the bobbin portion for holding the driving coil, etc., and the suspension 154 is connected to one end of the actuator arm 155.

The head slider 153 having the magnetoresistive effect element or the magnetic head according to one of the preceding embodiment described with reference to FIGS. 1 to 20 is attached to the tip of the suspension 154. The suspension 154 has a lead wire 164 for writing and reading a signal. This lead wire 164 and each electrode of the magnetic head assembled into the head slider 153 are electrically connected to each other. In FIG. 22, reference numeral 165 designates an electrode pad of the magnetic head assembly 160.

According to this embodiment, since the magnetoresistive effect element or the magnetic head of one of the preceding embodiments described with reference to FIGS. 1 to 20 is provided, information magnetically recorded in the medium disk 200 can be reliably read at a higher recording density than that in the related art.

Ninth Embodiment

A magnetic memory having the magnetoresistive effect element according to one of the preceding embodiments will next be described as a ninth embodiment of the invention. Namely, for example, the magnetic memory such as a magnetic random access memory having memory cells arranged in a matrix shape can be realized by using the magnetoresistive effect element according to one of the preceding embodiments described with reference to FIGS. 1 to 20.

Figure 23:
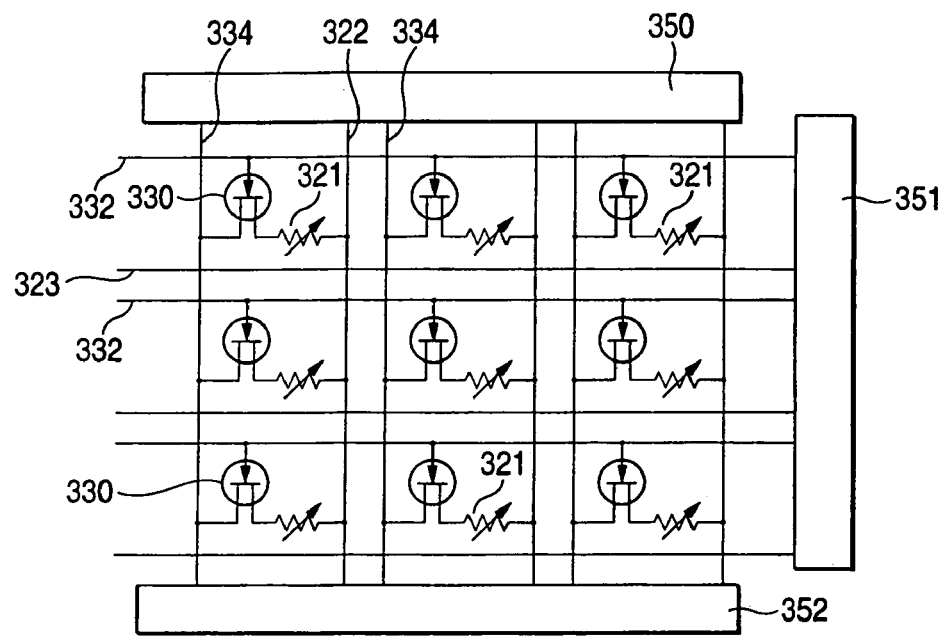
FIG. 23 is a schematic view showing a matrix configuration of a magnetic memory according to an embodiment of the invention.

FIG. 23 is a conceptual view showing the matrix configuration of the magnetic memory of this embodiment.

Namely, FIG. 23 shows a circuit configuration of this embodiment in which the memory cells are arranged in an array shape. A column decoder 350 and a row decoder 351 are arranged to select one bit in the array. A switching transistor 330 is turned on by a bit line 334 and a word line 332 and is uniquely selected. Bit information recorded in a magnetic recording layer forming the magnetoresistive effect element 321 can be read by the detection of a sense amplifier 352.

Writing of the bit information is performed by a magnetic field generated by flowing a writing current to specific writing word line 323 and bit line 322.

Figure 24:
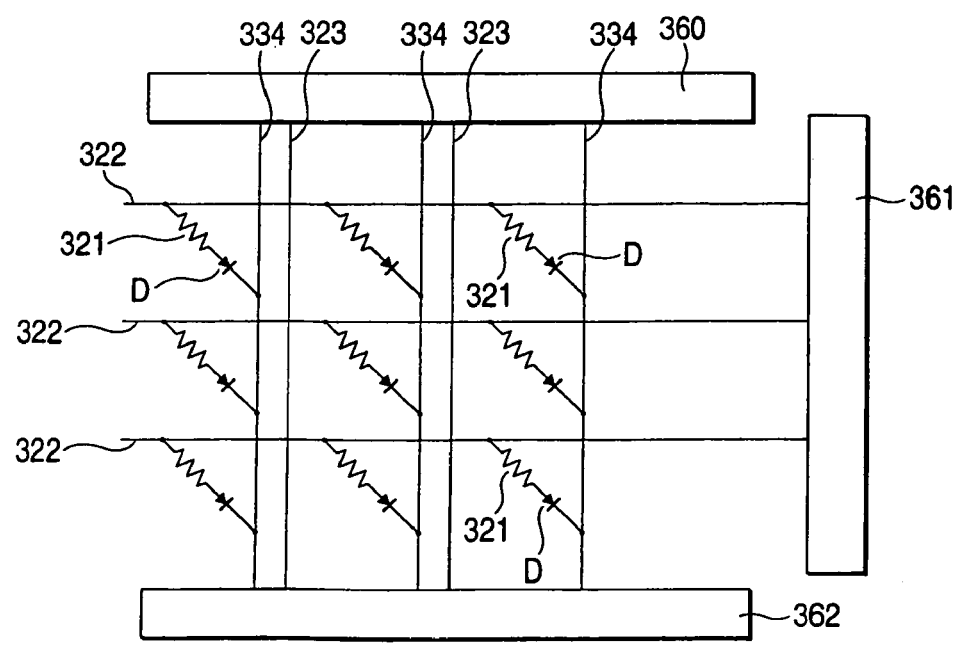
FIG. 24 is a schematic view showing another specific example of the matrix construction of the magnetic memory.

FIG. 24 is a conceptual view showing another specific example of the matrix configuration of the magnetic memory of this embodiment. Namely, in the case of this specific example, the bit line 322 and the word line 334 wired in the matrix shape are respectively selected by the decoders 360, 361, and a specific memory cell in the array is selected. Each memory cell has a structure in which the magnetoresistive effect element 321 and a diode D are connected in series. Here, the diode D has a function of preventing the sense current from being detoured in the memory cell except for the selected magnetoresistive effect element 321.

The writing operation is performed by the magnetic field generated by flowing the writing current to each of the specific bit line 322 and writing word line 323.

Figure 25:
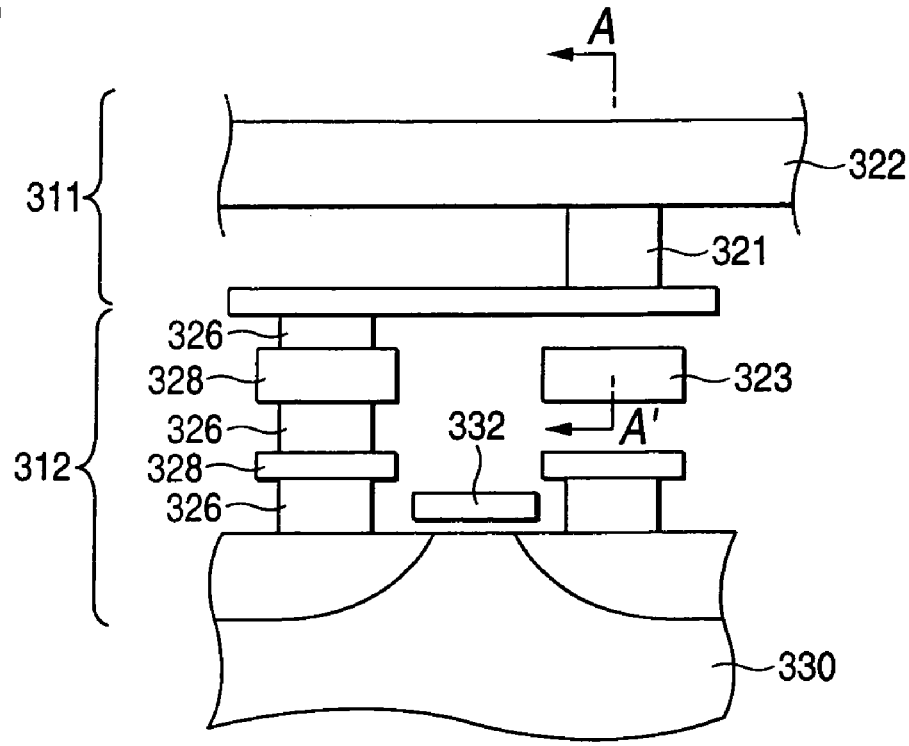
FIG. 25 is a schematic view showing a sectional structure of a main portion of the magnetic memory according to the embodiment of the invention.
Figure 26:
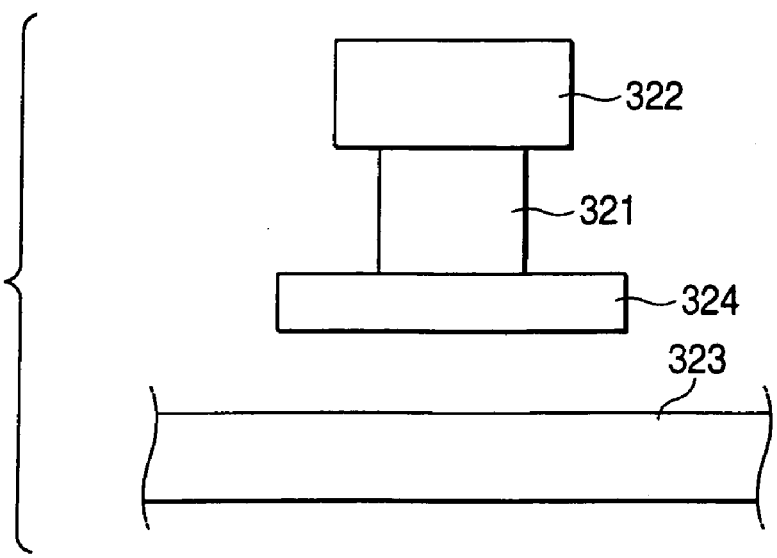
FIG. 26 is a section view taken along line A-A' of FIG. 24.

FIG. 25 is a conceptual view showing the section structure of a main portion of the magnetic memory according to this embodiment of the invention. FIG. 26 is a section view taken along line A-A' of FIG. 25.

Namely, the structure shown in FIGS. 25 and 26 corresponds to one memory cell included in the magnetic memory shown in FIG. 23. Namely, this memory cell is a memory cell of one bit portion of the magnetic memory operated as a random access memory. This memory cell has a memory element portion 311 and a transistor portion 312 for an address selection.

The memory element portion 311 has the magnetoresistive effect element 321 and a pair of wirings 322, 324 connected to the magnetoresistive effect element 321. The magnetoresistive effect element 321 is the magnetoresistive effect element according to one of the preceding embodiments described with reference to FIGS. 1 to 20 and has a laminating structure in which the absolute value of resistance is high and a large magnetoresistive effect is obtained by providing the resistance increasing layer RI and the thick spin filter layer SF.

When the bit information is read, the sense current is flowed in the magnetoresistive effect element 321 and its resistance change is detected. The pinned layer acts as a magnetization pinned layer, and the free layer acts as a magnetic recording layer.

On the other hand, a transistor 330 connected through a via 326 and a burying wiring 328 is provided in the transistor portion 312 for selection. This transistor 330 is switched and operated in accordance with a voltage applied to a gate 332, and controls opening/closing of a current path of the magnetoresistive effect element 321 and the wiring 334.

Further, a writing wiring 323 is disposed below the magnetoresistive effect element 321 in the direction approximately perpendicular to the wiring 322. For example, these writing wirings 322, 323 can be formed of aluminum (Al), copper (Cu), tungsten (W), tantalum (Ta) or an alloy including one of these elements.

When the bit information is written to the magnetoresistive effect element 321 in the memory cell having such a configuration, writing pulse currents are flowed in the wirings 322, 323, and the magnetization of a recording layer of the magnetoresistive effect element is suitably inverted by applying a synthetic magnetic field induced by these currents.

Further, when the bit information is read, the sense current is flowed through the wiring 322, the magnetoresistive effect element 321 including the magnetic recording layer, and a lower electrode 324, and the resistance value of the magnetoresistive effect element 321 or a change in the resistance value is measured.

In the magnetic memory of this specific example, a large negative magnetoresistive effect is obtained by using the magnetoresistive effect element according to one of the preceding embodiments described with reference to FIGS. 1 to 20. Therefore, even when the size of a cell is minutely reduced, a reliable writing operation is secured by reliably controlling the magnetic domain of the recording layer, and the reading operation can be reliably performed.

In the above description, the embodiments of the invention have been described with reference to the specific examples. However, the invention is not limited to these specific examples. For example, the invention may be practiced by suitably making selections from the publicly known range of a person skilled in the art with regard to a specific structure of the magnetoresistive effect film, shapes and materials of electrodes, a bias application film, an insulating film, to obtain the similar effect.

For example, when the magnetoresistive effect element is applied to the magnetic head for reproduction, detecting resolution of the magnetic head can be prescribed by giving a magnetic shield above and below the element.

Further, similar effects can be obtained by similarly applying the invention to the magnetic head or the magnetic reproducing apparatus of a vertical magnetic recording system as well as a longitudinal magnetic recording system.

Further, the magnetic reproducing apparatus according to the embodiments of the invention may be also set to a so-called fixing type stationarily having a specific recording medium. On the other hand, a so-called "removable" system able to replace the recording medium may be also used.

In addition, all magnetoresistive effect elements, magnetic heads, magnetic memory regenerators and magnetic memories that a person skilled in the art can make design change on the basis of the magnetic head and the magnetic memory regenerator described above as the embodiments of the invention also belong to the scope of the invention.

What is claimed is:

1. A magnetoresistive effect element comprising:
   a magnetization pinned layer including a magnetic-material film in which a magnetization direction is substantially pinned in one direction;
   a magnetization free layer including a magnetic-material film in which a magnetization direction changes in response to an external magnetic field;
   a nonmagnetic metal layer disposed between the magnetization pinned layer and the magnetization free layer;
   a resistance increasing layer that includes an insulation portion and a conductive portion electrically connecting both film faces of the resistance increasing layer, and is disposed in at least one of the magnetization pinned layer, the magnetization free layer, and the nonmagnetic metal layer;
   a spin filter layer that is disposed to be adjacent to the magnetization free layer and has a thickness in a range of 5 nm to 20 nm, the magnetization free layer being disposed between the spin filter layer and the nonmagnetic metal layer; and a pair of electrodes between which the magnetization pinned layer, the magnetization free layer, the nonmagnetic layer, the resistance increasing layer, and the spin filter layer are disposed, current that flows between the pair of electrodes flowing in a direction substantially perpendicular to film faces of the magnetization pinned layer, the magnetization free layer, the nonmagnetic metal layer, the resistance increasing layer, and the spin filter layer.

2. The magnetoresistive effect element according to claim 1, wherein:

the magnetic-material film of the magnetization pinned layer includes a ferromagnetic material; and the magnetic-material film of the magnetization free layer includes a ferromagnetic material.

3. The magnetoresistive effect element according to claim 1, wherein ohmic contacts are formed between the resistance increasing layer and layers adjacent thereto.

4. The magnetoresistive effect element according to claim 1, wherein the insulation portion of the resistance increasing layer includes one of an oxide, a nitride, and a fluoride of one selected from a group consisting of Al, Si, Ti, V, Cr, Mn, Fe, Co, Ni, Cu, Zn, Y, Zr, Nb, Hf, Ta, and W.

5. The magnetoresistive effect element according to claim 1, wherein:

the resistance increasing layer is disposed in at least one of the magnetization pinned layer and the magnetization free layer; and the conductive portion includes a ferromagnetic material.

6. The magnetoresistive effect element according to claim 1, wherein:

the resistance increasing layer is disposed at least in the nonmagnetic metal layer; and the conductive portion includes a nonmagnetic metal.

7. The magnetoresistive effect element according to claim 1, wherein:

the spin filter layer has the thickness in a range of 10 nm to 20 nm.

8. The magnetoresistive effect element according to claim 1, wherein the spin filter layer includes $(Ni_{100-x}Fe_x)_{100-y}Cr_y$ alloy where $15<x<25$ and $20<y<45$.

9. The magnetoresistive effect element according to claim 8, further comprising:

a protecting layer that is adjacent to the spin filter layer and includes at least one selected from a group consisting of Ta, Ti, and Ru.

10. The magnetoresistive effect element according to claim 1, further comprising:

a protecting layer adjacent to the spin filter layer, wherein the spin filter layer is disposed between the protecting layer and the magnetization free layer.

11. The magnetoresistive effect element according to claim 10, wherein:

the protecting layer consists of Ta; and the spin filter layer includes at least one selected from a group consisting of Cu, Au, Ag, Pt, Cr, Ti, Zn, Zr, Nb, Pt, Pd, Rh, Ru, Mo, Hf, and $(Ni_{100-x}Fe_x)_{100-y}Cr_y$ alloy where $15<x<25$ and $20<y<45$.

12. The magnetoresistive effect element according to claim 10, wherein:

the protecting layer consists of Ti; and the spin filter layer includes at least one selected from a group consisting of Cu, Au, Ag, Pt, Cr, Ta, Zn, Zr, Nb, Pt, Pd, Rh, Ru, Mo, Hf, and $(Ni_{100-x}Fe_x)_{100-y}Cr_y$ alloy where $15<x<25$ and $20<y<45$.

13. The magnetoresistive effect element according to claim 10, wherein:

the protecting layer consists of Ru; and the spin filter layer includes at least one selected from a group consisting of Cu, Au, Ag, Pt, Cr, Ti, Ta, Zn, Zr, Nb, Pt, Pd, Rh, Mo, Hf, and $(Ni_{100-x}Fe_x)_{100-y}Cr_y$ alloy where $15<x<25$ and $20<y<45$.

14. The magnetoresistive effect element according to claim 10, wherein:

the protecting layer includes at least one selected from a group of Ta, Ti, and Ru; and the spin filter layer includes a laminating structure of Cu and $(Ni_{100-x}Fe_x)_{100-y}Cr_y$ alloy where $15<x<25$ and $20<y<45$ in this order when viewed from a side contacting with the magnetization free layer.

15. The magnetoresistive effect element according to claim 10, wherein:

the protecting layer includes at least one selected from a group of Ta and Ti; and the spin filter layer includes a laminating structure of Cu and Ru.

16. A magnetic head comprising:

a magnetoresistance effect element including:

a magnetization pinned layer including a magnetic-material film in which a magnetization direction is substantially pinned in one direction;

a magnetization free layer including a magnetic-material film in which a magnetization direction changes in response to an external magnetic field;

a nonmagnetic metal layer disposed between the magnetization pinned layer and the magnetization free layer;

a resistance increasing layer that includes a insulation portion and a conductive portion electrically connecting both film faces of the resistance increasing layer, and is disposed in at least one of the magnetization pinned layer, the magnetization free layer, and the nonmagnetic metal layer;

a spin filter layer that is disposed to be adjacent to the magnetization free layer and has a thickness in a range of 5 nm to 20 nm, the magnetization free layer being disposed between the spin filter layer and the nonmagnetic metal layer; and a pair of electrodes between which the magnetization pinned layer, the magnetization free layer, the nonmagnetic layer, the resistance increasing layer, and the spin filter layer are disposed, current that flows between the pair of electrodes flowing in a direction substantially perpendicular to film faces of the magnetization pinned layer, the magnetization free layer, the nonmagnetic metal layer, the resistance increasing layer, and the spin filter layer.

17. A magnetic reproducing apparatus for reading informed magnetically recorded on a magnetic recording medium, the apparatus comprising:

a magnetic head that includes a magnetoresistance effect element including:

a magnetization pinned layer including a magnetic-material film in which a magnetization direction is substantially pinned in one direction;

a magnetization free layer including a magnetic-material film in which a magnetization direction changes in response to an external magnetic field;

a nonmagnetic metal layer disposed between the magnetization pinned layer and the magnetization free layer;

a resistance increasing layer that includes a insulation portion and a conductive portion electrically connecting both film faces of the resistance increasing layer, and is disposed in at least one of the magnetization pinned layer, the magnetization free layer, and the nonmagnetic metal layer;

a spin filter layer that is disposed to be adjacent to the magnetization free layer and has a thickness in a range of 5 nm to 20 nm, the magnetization free layer being disposed between the spin filter layer and the nonmagnetic metal layer; and a pair of electrodes between which the magnetization pinned layer, the magnetization free layer, the nonmagnetic layer, the resistance increasing layer, and the spin filter layer are disposed, current that flows between the pair of electrodes flowing in a direction substantially perpendicular to film faces of the magnetization pinned layer, the magnetization free layer, the nonmagnetic metal layer, the resistance increasing layer, and the spin filter layer.

* * * * *